US00RE41879E

(19) United States
(12) Reissued Patent
Iwanari et al.

(10) Patent Number: US RE41,879 E
(45) Date of Reissued Patent: Oct. 26, 2010

(54) SEMICONDUCTOR MEMORY DEVICE

(75) Inventors: Shunichi Iwanari, Kadoma (JP); Masahiko Sakagami, Kadoma (JP); Hiroshige Hirano, Kadoma (JP); Tetsuji Nakakuma, Kadoma (JP); Takashi Miki, Kadoma (JP); Yasushi Gohou, Kadoma (JP); Kunisato Yamaoka, Kadoma (JP); Yasuo Murakuki, Kadoma (JP)

(73) Assignee: Panasonic Corporation, Osaka (JP)

(21) Appl. No.: 12/155,392

(22) Filed: Jun. 3, 2008

Related U.S. Patent Documents

Reissue of:
(64) Patent No.: 7,280,406
Issued: Oct. 9, 2007
Appl. No.: 11/344,199
Filed: Feb. 1, 2006

(30) Foreign Application Priority Data

Feb. 1, 2005 (JP) ..... 2005-025222

(51) Int. Cl.
*G11C 16/06* (2006.01)

(52) U.S. Cl. ..... 365/185.21; 365/233.1; 365/189.04; 365/191; 365/109; 365/145

(58) Field of Classification Search ..... 365/185.21, 365/191, 109, 117, 233.1, 189.04, 196, 205, 365/145
See application file for complete search history.

(56) References Cited

U.S. PATENT DOCUMENTS 4,660,180 A * 4/1987 Tanimura et al. ..... 365/222
5,818,771 A 10/1998 Yasu et al.
6,891,775 B2 5/2005 Takeuchi
6,901,026 B2 5/2005 Takeuchi et al.
6,950,345 B1 9/2005 Tokiwa ..... 365/185.22
2004/0027903 A1 2/2004 Kato ..... 365/222

FOREIGN PATENT DOCUMENTS

JP 10-106276 4/1998
JP 2003-308692 10/2003

OTHER PUBLICATIONS

"Transistor Gijutsu Special" CQ Publishing Co., Ltd., Jan. 1, 1991, No. 25, pp. 23–27.

* cited by examiner

*Primary Examiner*—Thong Q Le
(74) *Attorney, Agent, or Firm*—McDermott Will & Emery LLP

(57) ABSTRACT

Provided is a semiconductor memory device compatible with a SRAM and capable of a high-speed data transfer operation while maintaining data reliability. An access to a memory core 6 starts when an external chip enable signal XCE performs a falling transition. Simultaneously, an external write enable signal XWE and an external address signal ADD are received, and a memory cell 1, in the memory core 6, corresponding to the received external address signal ADD is selected. When a data read-out from the memory cell 1 or a data write-in to the memory cell 1 is complete, a rewrite timer 7 is activated in accordance with a rising transition of an external chip enable signal XCE or a rising transition of the external write enable signal XWE for performing a data rewrite for the memory cell 1.

32 Claims, 26 Drawing Sheets

PRIOR ART

PRIOR ART

PRIOR ART

PRIOR ART

PRIOR ART

SEMICONDUCTOR MEMORY DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor memory device, and more particularly, to a semiconductor memory device compatible with a SRAM and employing a ferroelectric memory or a DRAM for a memory core thereof.

2. Description of the Background Art

In recent years, cellular phones have gained popularity causing a high demand for a pseud-SRAM configured for the cellular phones. Such a pseud-SRAM includes: an asynchronous pseud-SRAM asynchronously operating with an external input signal; a synchronous pseud-SRAM synchronously operating with an external input signal such as an external chip enable signal, and internally generating a clock signal in chronological order for controlling an internal operation; and the like. In order to enhance the degree of integration, a DRAM or a ferroelectric memory (FeRAM: ferroelectric RAM) is used for a memory core of these pseud-SRAMs and they are mass-produced.

A pseud-SRAM configured as shown in FIG. 21 is an example of a conventionally used pseud-SRAM. The pseud-SRAM shown in FIG. 21 receives data to be written when an external write enable signal XWE rises, as illustrated in a timing chart of FIG. 22.

Other examples of the pseudo-SRAM are: a pseud-SRAM receiving data to be written in accordance with a falling transition of an external write enable signal, as shown in FIGS. 23 and 24 (see "Transistor Gijutsu SPECIAL" No. 25, CQ Publishing Co., Ltd., Jan. 1, 1991, p. 23); a pseud-SRAM of a late-write system (see Japanese Laid-Open Patent Publication No. 2003-308692); a pseud-SRAM receiving an address in accordance with a falling transition of an external chip enable signal XCE, and the received address may change its value after a certain period of time is passed (held) from the falling transition of the external chip enable signal XCE, as shown in FIGS. 25 and 26 (see Japanese Laid-Open Patent Publication No. 10-106275); and the like.

However, the conventional pseud-SRAM has following problems. In the conventional pseud-SRAM, one cycle completes when an address is received in synchronization with an external chip enable signal XCE, and then data to be written is received into a chip, as necessary, in accordance with transitions of the external write enable signal XWE. Under such a scheme, when a ferroelectric memory or a DRAM causing a data destruction as a result of a read-out is used for a memory core, a data rewrite operation becomes necessary. When a time period for the data rewrite operation is considered, a cycle time becomes long, and thus, the conventional pseud-SRAM is not suited for a high-speed input/output of data.

Further, a synchronous pseud-SRAM capable of successively transferring data at a high-speed has been proposed, but, to achieve such a high-speed transfer, a pin needs to be separately provided for an external reference clock signal, and therefore, a problem of compatibility with SRAM emerges.

Further, although a time period to perform the rewrite operation can be sufficiently provided by using a portion of a time period during which the external chip enable signal XCE is taking an "H" level (time period for precharging) or the like, if noise is generated in the external chip enable signal XCE while precharging, a sufficient precharge time required for the rewrite cannot be ensured. In addition, if a voltage drop due to a power cut occurs before a completion of one cycle, a sufficient precharge time cannot be ensured, thereby disabling a completion of the rewrite operation, in some cases.

As such, when a rewrite operation is performed during the precharge time for the external chip enable signal XCE, there is a problem that a sufficient time period required for the rewrite cannot always be ensured due to an external factor. When, particularly, a ferroelectric memory is used, data retention is essential, and therefore, ensuring a sufficient time period for a rewrite operation is important.

As described above, the conventional pseud-SRAM has problems in data reliability and performing a high-speed process. Also, in addition to the above problems, the pseud-SRAM employing a ferroelectric memory has a problem in noise tolerance and data retention in a case of a power cut.

SUMMARY OF THE INVENTION

Therefore, an object of the present invention is to provide a semiconductor memory device which employs a ferroelectric memory or a DRAM for a memory core thereof, is compatible with a SRAM, and is capable of a high-speed data transfer operation while maintaining data reliability.

A first aspect of the present invention is directed to a semiconductor memory device. The semiconductor memory device comprises: a memory section including a memory element in which a stored content is destroyed as a result of a read-out; a timer control circuit for outputting a start signal when either a first or a second signal takes an inactive state earlier than the other; a timer circuit for outputting a timer signal for a predetermined period of time from when the start signal is outputted; and a memory section control circuit for activating the memory section during a time period from when the first signal takes an active state to when the timer signal stops being outputted, and performing a rewrite for the memory section while the timer signal is being outputted.

A second aspect of the present invention is directed to a semiconductor memory device. The semiconductor memory device comprises: a memory section including a memory element in which a stored content is destroyed as a result of a read-out; a timer control circuit for outputting a start signal when, in a data read-out operation, a first signal takes an active state, or when, in a data write-in operation, either the first or a second signal takes an inactive state earlier than the other; a timer circuit for outputting a timer signal for a predetermined period of time from when the start signal is outputted; and a memory section control circuit for activating the memory section during a time period from when the first signal takes the active state to when the timer signal stops being outputted, and performing a rewrite for the memory section while the timer signal is being outputted.

It is preferable that the timer control circuit output the start signal even when a supplied power supply voltage detection signal indicates a reduction in a power supply voltage.

Further, it is preferable that the first signal be an external chip enable signal, and the second signal be an external write enable signal.

Further, it is preferable that, while the timer signal is being outputted, the timer control circuit prevent an external signal from being inputted.

Further, it is preferable that the semiconductor memory device of the present invention further comprise: an operation control circuit for receiving the second signal when the first signal takes an active state, and determining whether an operation to be performed is a data read-out or a data write-in in accordance with the received second signal; and an access circuit for accessing to the memory section in accordance with the operation determined by the operation control circuit.

In this case, it is preferable that the access circuit access, after a predetermined period of time is elapsed from a transition of the first signal, to the memory section in accordance with either a transition of the second signal from the inactive state to the active state or a transition of the second signal from the active state to the inactive state.

Further, the first signal may be an external chip enable signal, and the second signal may be an external output enable signal.

Further, in the semiconductor memory device of the present invention, when the second signal performs a transition within a predetermined period of time from when the first signal takes the active state, an access to the memory section may be controlled by a signal generated by an internal circuit.

Alternatively, in the semiconductor memory device of the present invention, when the second signal performs a transition after the predetermined period of time from when the first signal takes the active state, the access to the memory section may be controlled by an externally inputted signal.

Further, it is preferable that the memory section include: a sense amplifier for receiving data read out from the memory element; and a switch for disconnecting between the sense amplifier and the memory element, and the switch opens after the data read out from the memory element is received into the sense amplifier.

In this case, it is preferable that the timer circuit output the timer signal after the switch opens.

Further, it is preferable that the memory element include a ferroelectric cell.

Alternatively, the memory element may include a dynamic cell.

According to the semiconductor memory device of the present invention, a data rewrite for the memory section is performed while the timer circuit is outputting the timer signal, and therefore, a sufficient time period for the rewrite is ensured, thereby enhancing reliability in data retention.

Also, when the power supply voltage detection signal indicates a reduction in the power supply voltage, the timer control circuit outputs the start signal for performing the rewrite, and therefore, the data rewrite can be performed before the power supply voltage is reduced to equal to or lower than a certain value, thereby protecting data in a case where the power supply voltage is reduced.

Also, during the rewrite for the memory section, an external signal input is prevented, and therefore, the rewrite will not be interrupted due to noise contained in the external signal, thereby enhancing reliability in data retention.

Also, according to the semiconductor memory device of the present invention, a data read-out or a data write-in in synchronization with an external signal is possible, thereby enabling a high-speed data input/output.

Also, the data read-out or the data write-in in synchronization with a signal inputted from a SRAM is possible, thereby allowing to provide a high-speed semiconductor memory device compatible with a SRAM.

Also, the semiconductor memory device of the present invention can switch between an operation controlled by an internal circuit and an operation controlled by an external signal, allowing a switching of operations depending on an intended purpose, and thereby increasing a level of convenience.

Also, the semiconductor memory device of the present invention can receive the read out data into the sense amplifier, allowing to disconnect between a bit line and a memory element having a large amount of load and the sense amplifier, and thereby enabling a high-speed data input/output.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
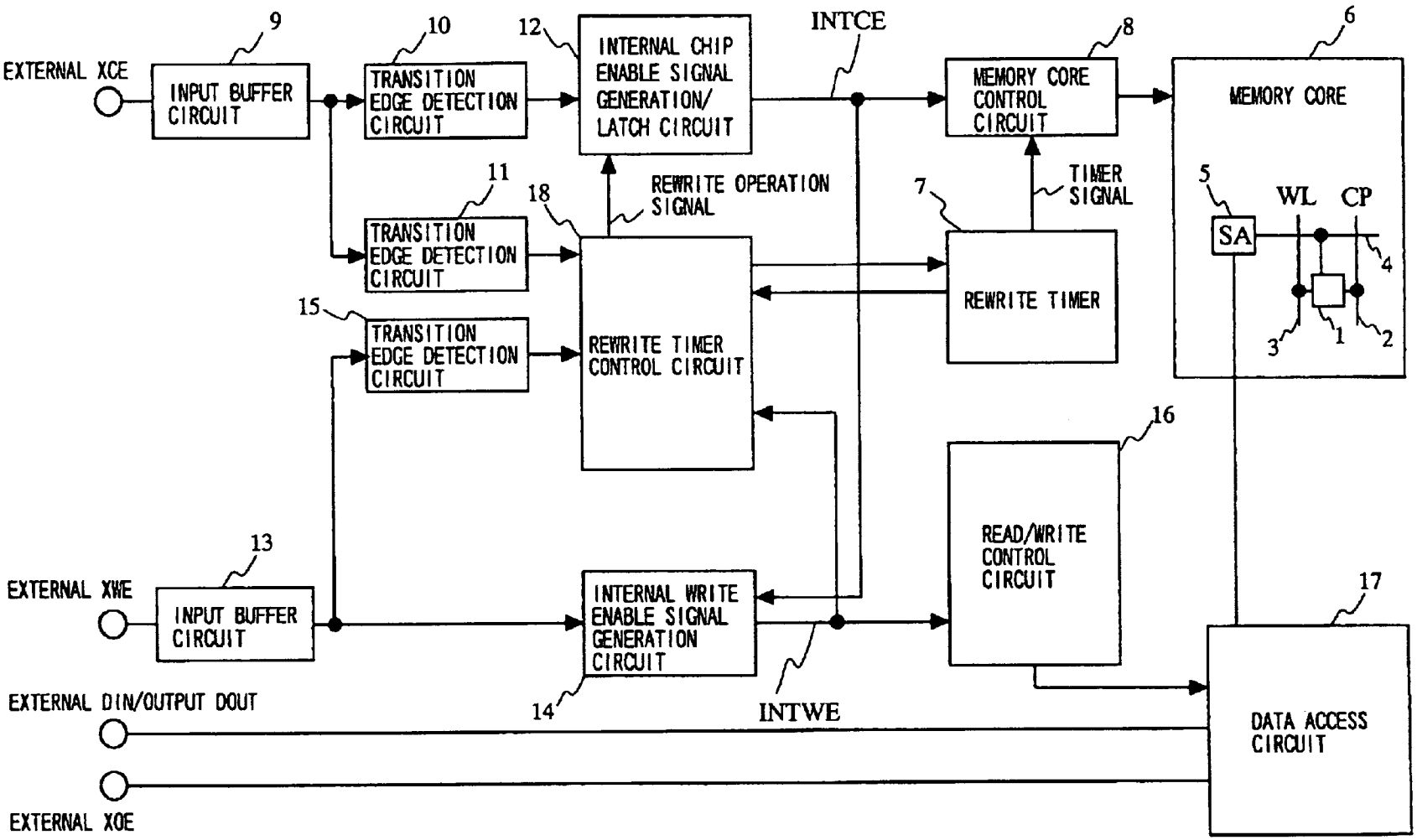
FIG. 1 is a configuration diagram of a semiconductor memory device according to a first embodiment of the present invention.

Hereinafter, with reference to the drawings, a semiconductor memory device according to a first embodiment of the present invention is described. FIG. 1 is a diagram illustrating a configuration of the semiconductor memory device according to the present embodiment.

The semiconductor memory device shown in FIG. 1 includes: a memory core 6; a rewrite timer 7, a memory core control circuit 8; input buffer circuits 9 and 13; transition edge detection circuits 10, 11, and 15; an internal chip enable signal generation/latch circuit 12; an internal write enable signal generation circuit 14; a read/write control circuit 16; a data access circuit 17; and a rewrite timer control circuit 18.

The memory core 6 is a ferroelectric memory including memory cells 1, cell plates 2, word lines 3, bit lines 4, and sense amplifiers 4. The memory cell 1 is a memory cell having a ferroelectric material on a capacitor insulating film. The cell plate 2 is provided to write data to the memory cell 1. The word line 3 and the bit line 4 are provided to select one of the memory cells 1 from among the memory cells 1, and to read and/or write data. The sense amplifier 5 is an amplification circuit for amplifying the data read out via the bit line 4.

The input buffer circuits 9 and 13 are buffer circuits for an external chip enable signal XCE and an external write enable signal XWE externally inputted to the semiconductor memory device shown in FIG. 1, respectively. The transition edge detection circuits 10 and 11 respectively detect falling and rising transitions of the external chip enable signal XCE. The transition edge detection circuit 15 detects rising transitions of the external write enable signal XWE.

The internal chip enable signal generation/latch circuit 12 generates, when a falling transition of the external chip enable signal XCE is detected by the transition edge detection circuit 10, an internal chip enable signal INTCE, and outputs the generated internal chip enable signal INTCE to the memory core control circuit 8 and the internal write enable signal generation circuit 14.

The internal write enable signal generation circuit 14 receives, in addition to the internal chip enable signal INTCE, the external write enable signal XWE outputted from the input buffer circuit 13. The internal write enable signal generation circuit 14 generates an internal write enable signal INTWE in response to the inputted external write enable signal XWE, and outputs the generated internal write enable signal INTWE to the read/write control circuit 16 and the rewrite timer control circuit 18.

When a rising transition of the external chip enable signal XCE is detected by the transition edge detection circuit 11, or when a rising transition of the external write enable signal XWE is detected by the transition edge detection circuit 15, the rewrite timer control circuit 18 activates the rewrite timer 7. The activated rewrite timer 7 outputs a timer signal to the memory core control circuit 8. The memory core control circuit 8 rewrites data to the memory core 6 while the timer signal is being inputted.

The read/write control circuit 16 receives the internal write enable signal INTWE outputted by the internal write enable signal generation circuit 14. The read/write control circuit 16 controls, in accordance with the inputted internal write enable signal INTWE, a read-out operation or a write-in operation performed for the memory core 6. The read-out or the write-in operation for the memory core 6 is performed via the data access circuit 17.

Figure 2:
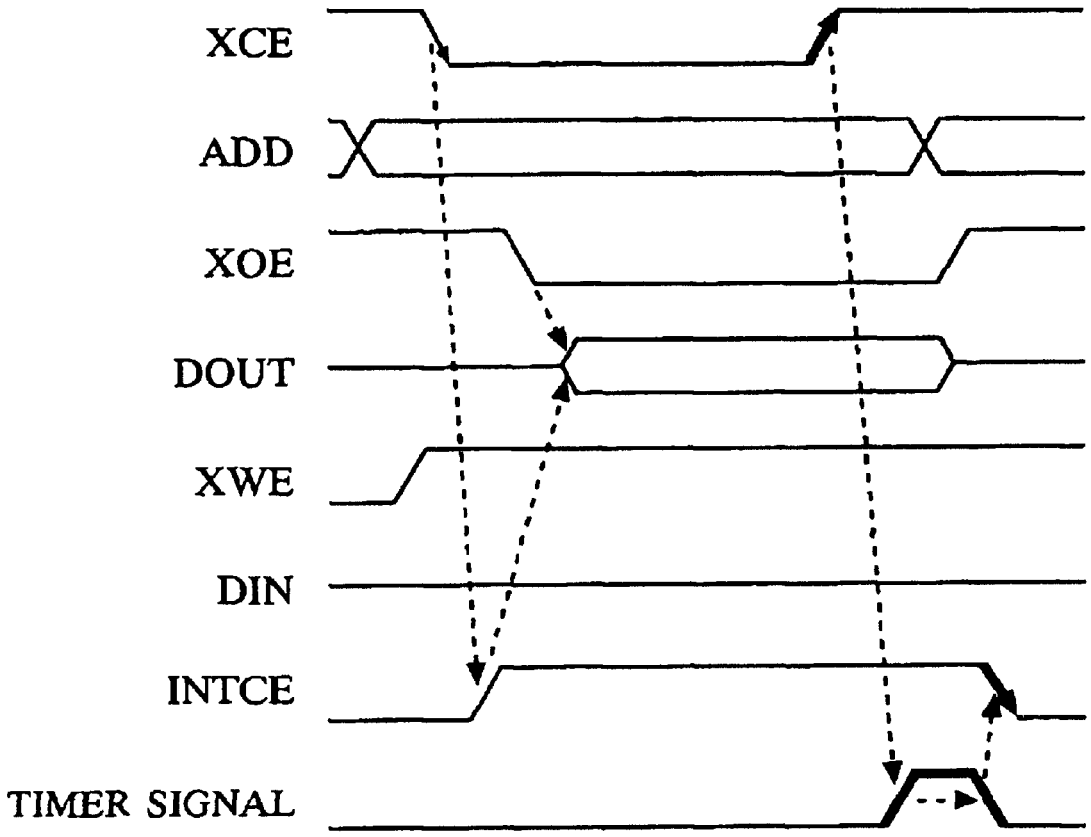
FIG. 2 is a timing chart illustrating a read-out operation of the semiconductor memory device shown in FIG. 1.
Figure 3A:
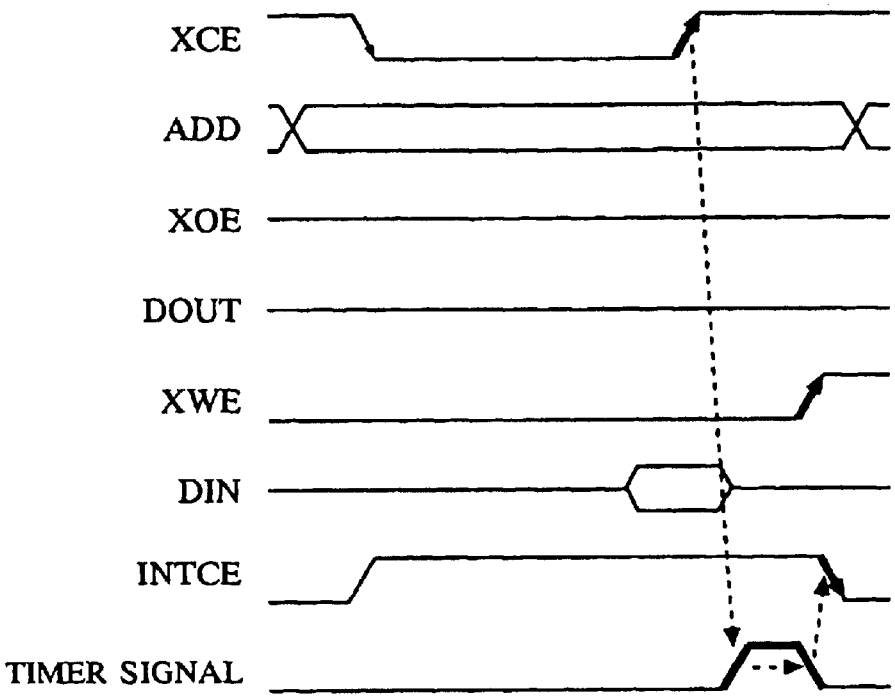
FIG. 3A is a timing chart illustrating a write-in operation, in the semiconductor memory device shown in FIG. 1, in synchronization with an "H" transition of an external chip enable signal XCE.
Figure 3B:
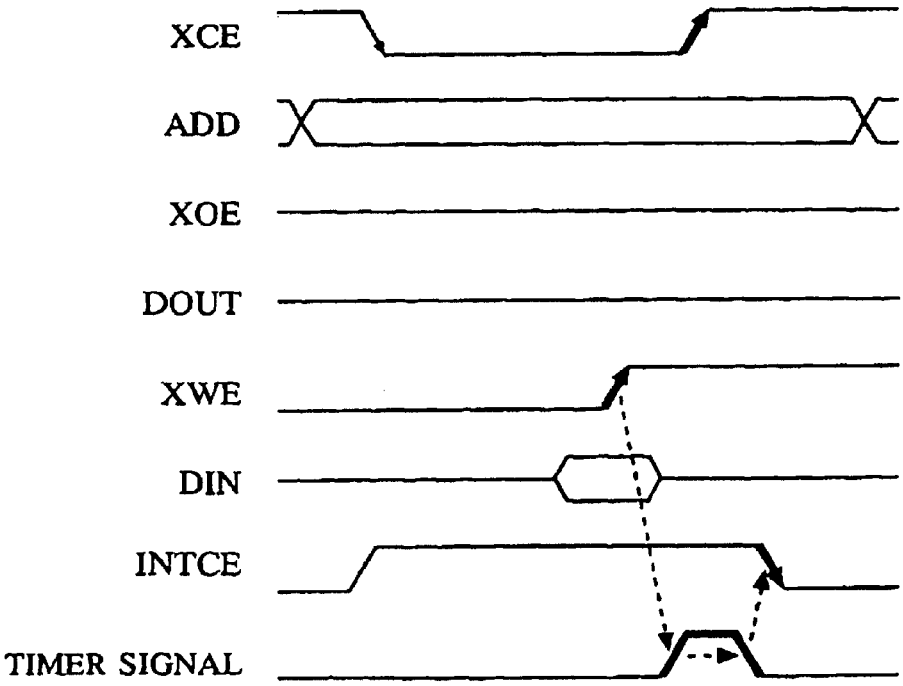
FIG. 3B is a timing chart illustrating a write-in operation, in the semiconductor memory device shown in FIG. 1, in synchronization with an "H" transition of an external write enable signal XWE.

Hereinafter, an operation of the semiconductor memory device according to the present embodiment is described with reference to the drawings. FIG. 2 is a timing chart illustrating a read-out operation of the semiconductor memory device according to the present embodiment. FIGS. 3A and 3B are timing charts each illustrating a write-in operation of the semiconductor memory device according to the present embodiment.

The data read-out and the data write-in are performed in the semiconductor memory device of the present embodiment as follows. When a falling transition (hereinafter, referred to as an "L" transition) of the external chip enable signal XCE is detected by the transition edge detection circuit 10, the internal chip enable signal generation/latch circuit 12 generates an internal chip enable signal INTCE, and outputs the internal chip enable signal INTCE to the memory core control circuit 8. When the internal chip enable signal INTCE is inputted, the memory core control circuit 8 is activated, and prepares to access to the memory core 6.

Also, the semiconductor memory device of the present embodiment receives an external write enable signal XWE and an external address signal ADD in synchronization with the "L" transition of the external chip enable signal XCE. The semiconductor memory device determines whether a read-out or a write-in operation is to be performed in accordance with the level of the external write enable signal XWE, and outputs, from the internal write enable signal generation circuit 14, an internal write enable signal INTWE indicating the read-out or the write-in operation. Further, the semiconductor memory device of the present embodiment selects a desired memory cell 1 in the memory core 6 in accordance with the received external address signal ADD, and accesses to the memory core 6 via the read/write control circuit 16 and the data access circuit 17.

Whether a read-out or write-in operation is to be performed is determined as follows. When the external chip enable signal XCE is in the "L" transition, if the external write enable signal XWE is at an "H" level, a read-out operation is to be performed, and if the external write enable signal XWE is at an "L" level, a write-in operation is to be performed.

In a read-out operation, data DOUT is outputted from the memory cell 1 in synchronization with an "L" transition of an external output enable signal XOE, as shown in FIG. 2.

The memory core 6 is a ferroelectric memory, and therefore, a data read-out from the memory core 6 is a destructive read-out thereby requiring a rewrite of the read out data. Accordingly, the semiconductor memory device of the present embodiment activates, after data is readout from the memory cell 1, the rewrite timer 7 in synchronization with a rising transition (hereinafter, referred to as an "H" transition) of the external chip enable signal XCE, and rewrites, concurrent with or after the output of the data DOUT, the data read out from the memory cell 1 to the memory cell 1.

Thereafter, with a completion of an operation of the rewrite timer 7, the rewrite for the memory cell 1 ends. Then, the internal chip enable signal generation/latch circuit 12 inactivates ("L" transition) the internal chip enable signal INTCE to end the chip operation.

On the other hand, in a write-in operation, an external input data signal DIN is received in synchronization with an "H" transition of the external write enable signal XWE, as shown in FIGS. 3A and 3B, and then written to a memory cell 1 specified by the external address signal ADD.

When performing a data write for the ferroelectric memory, to ensure an accurate data write, a data rewrite for the memory cell 1 is also required. This rewrite operation subsequent to the operation of the data write is performed by activating the rewrite timer 7 in synchronization with either the "H" transition (FIG. 3A) of the external chip enable signal XCE or the "H" transition (FIG. 3B) of the external write enable signal XWE occurring earlier than the other. The reason for the above is that the semiconductor memory device of the present embodiment is configured such that the external input data signal DIN is received in synchronization with either the "H" transition of the external chip enable signal XCE or the "H" transition of the external write enable signal XWE occurring earlier than the other.

Thereafter, similar to the read-out operation, the rewrite for the memory cell 1 ends with a completion of the operation of the rewrite timer 7. Finally, the internal chip enable signal INTCE is inactivated to end the chip operation.

As described above, the semiconductor memory device of the present embodiment activates the rewrite timer 7 during or after a data read, or otherwise after a data write, to rewrite data to the memory cell 1. Consequently, a sufficient time period for a rewrite operation is ensured, thereby enhancing reliability in data retention.

Figure 4:
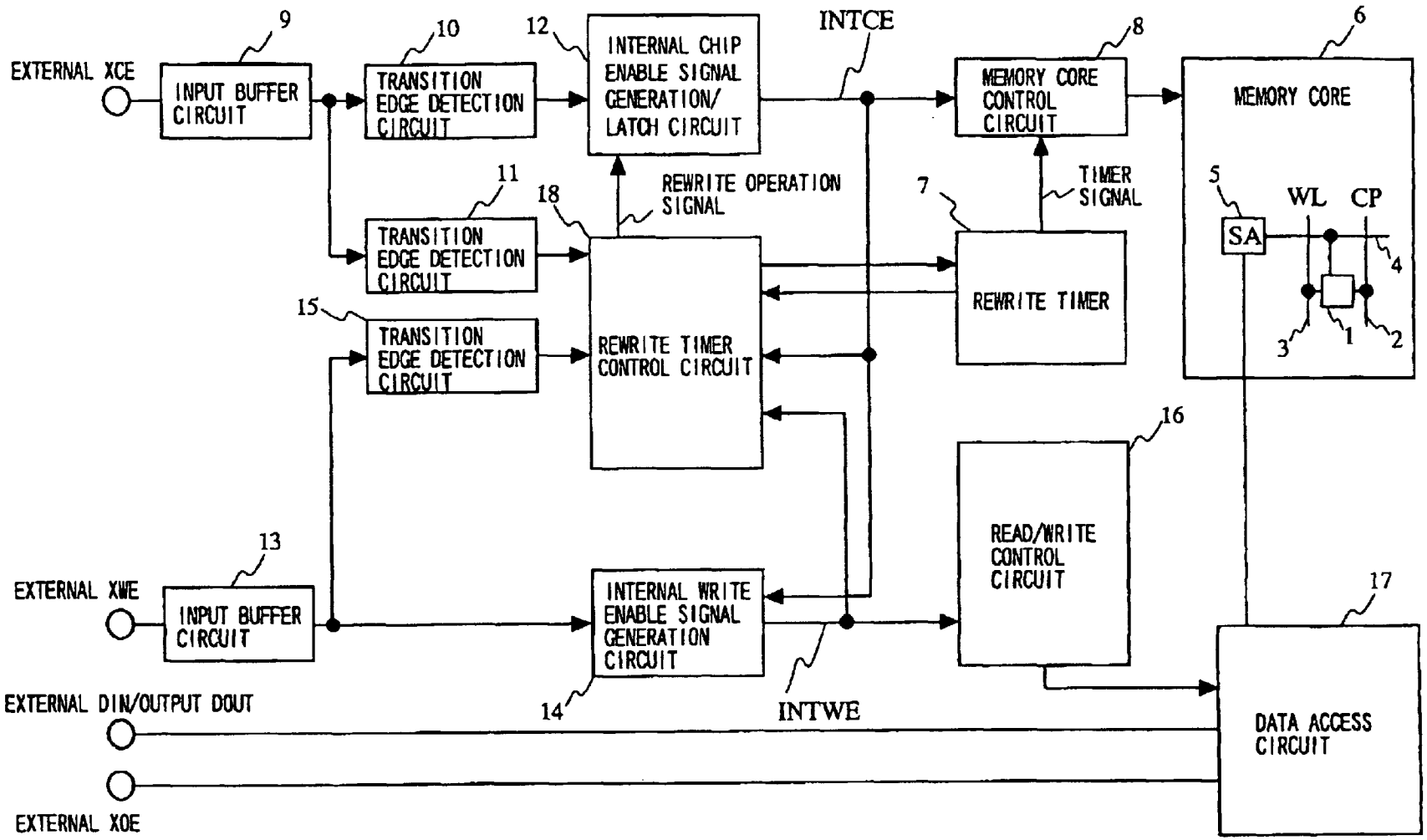
FIG. 4 is an alternative configuration diagram of the semiconductor memory device according to the first embodiment of the present invention.

Next, an alternative example of the semiconductor memory device according to the present embodiment is described. FIG. 4 is a diagram illustrating the alternative example of the semiconductor memory device according to the present embodiment. The difference between the semiconductor memory device shown in FIG. 4 and that shown in FIG. 1 is that, in the semiconductor memory device shown in FIG. 4, an internal chip enable signal INTCE is inputted to the rewrite timer control circuit 18.

Figure 5:
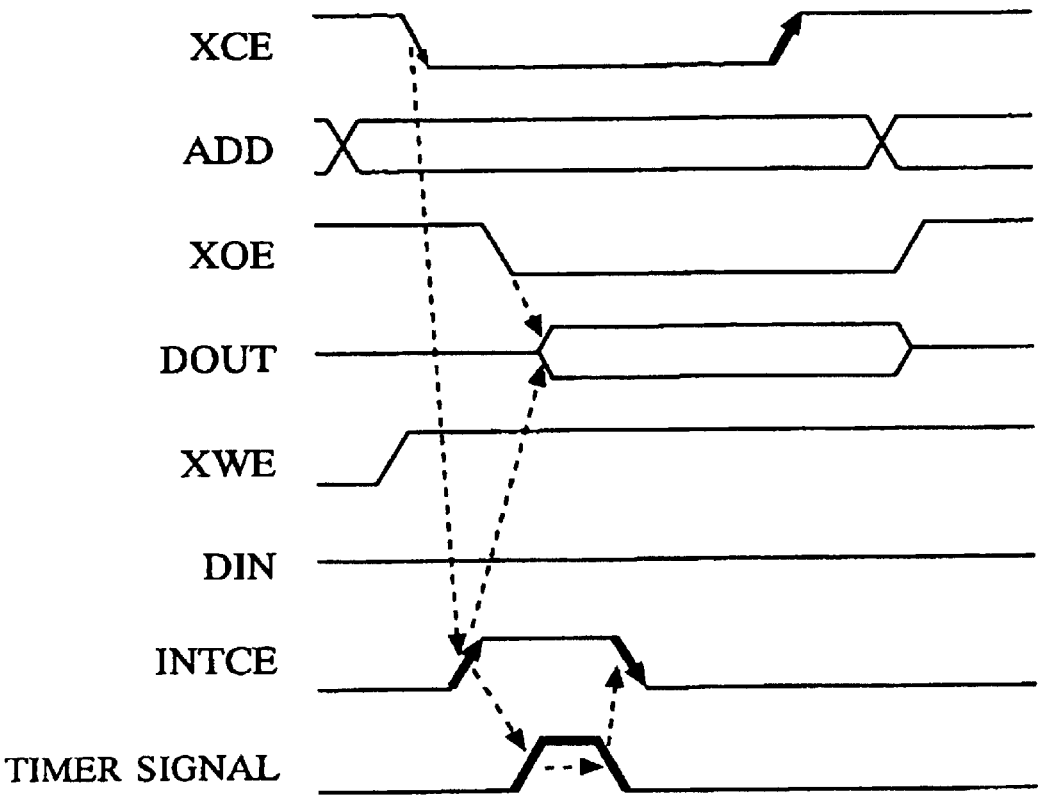
FIG. 5 is a timing chart illustrating a read-out operation of the semiconductor memory device shown in FIG. 4.

FIG. 5 is a timing chart illustrating a read-out operation of the semiconductor memory device shown in FIG. 4. In the read-out operation, the semiconductor memory device shown in FIG. 4 activates the rewrite timer 7 in synchronization with the internal chip enable signal INTCE for performing a rewrite concurrently with an output of data DOUT. As such, the semiconductor memory device of the present embodiment may start a rewrite operation in synchronization with an internal chip enable signal INTCE instead of an external chip enable signal XCE, namely, using internal timings. Note that a rewrite operation to the memory cell 1 after a write-in operation is similarly performed to that illustrated in FIG. 3B, and therefore, a description thereof is omitted.

Figure 6:
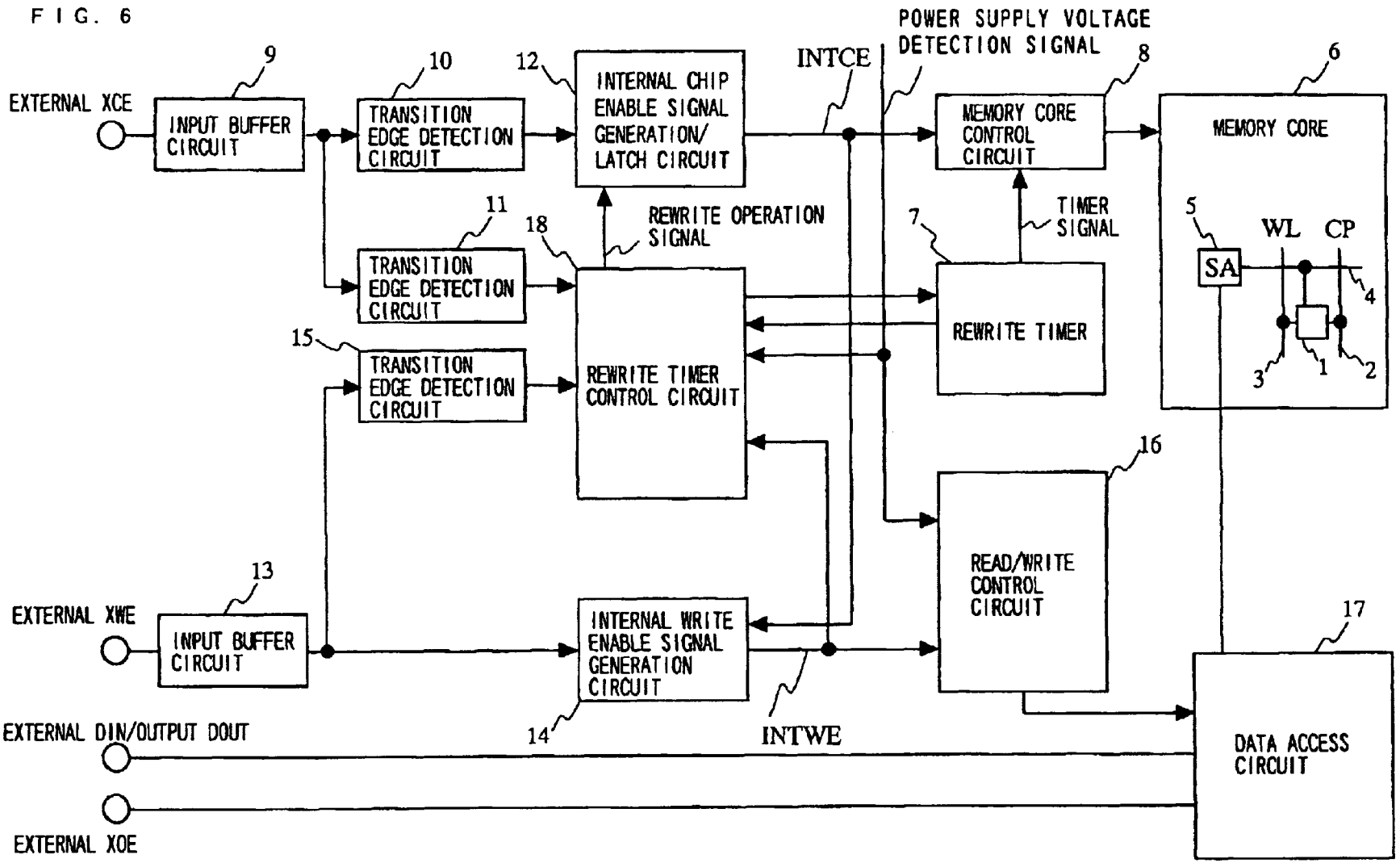
FIG. 6 is a still alternative configuration diagram of the semiconductor memory device according to the first embodiment of the present invention.

The semiconductor memory device of the present embodiment may be configured as shown in FIG. 6. The difference between the semiconductor memory device shown in FIG. 1 and that shown in FIG. 6 is that, in the semiconductor memory device shown in FIG. 6, a power supply voltage detection signal is inputted to the read/write control circuit 16 and the rewrite timer control circuit 18.

The semiconductor memory device shown in FIG. 6 is configured in consideration of a case where a power supply voltage is reduced before completion of operations caused by externally inputted signals. More specifically, the semiconductor memory device shown in FIG. 6 performs a rewrite operation before the power supply voltage is reduced to equal to or lower than a certain value, thereby protecting data stored in the memory cell 1.

Figure 7A:
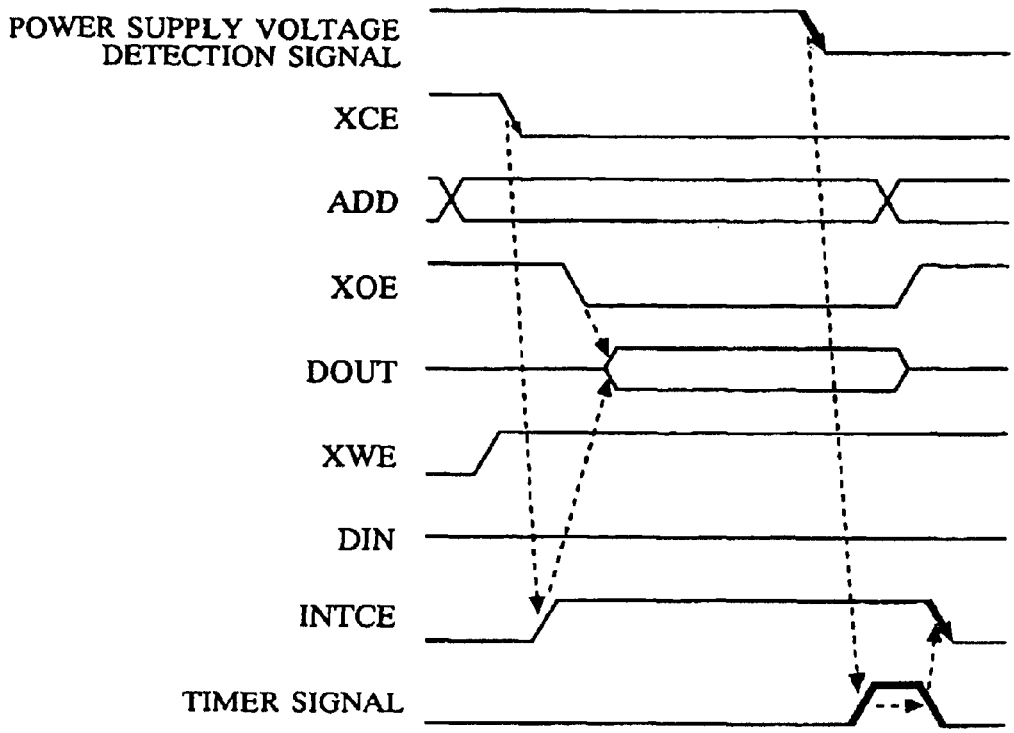
FIG. 7A is a timing chart illustrating a read-out operation of the semiconductor memory device shown in FIG. 6.
Figure 7B:
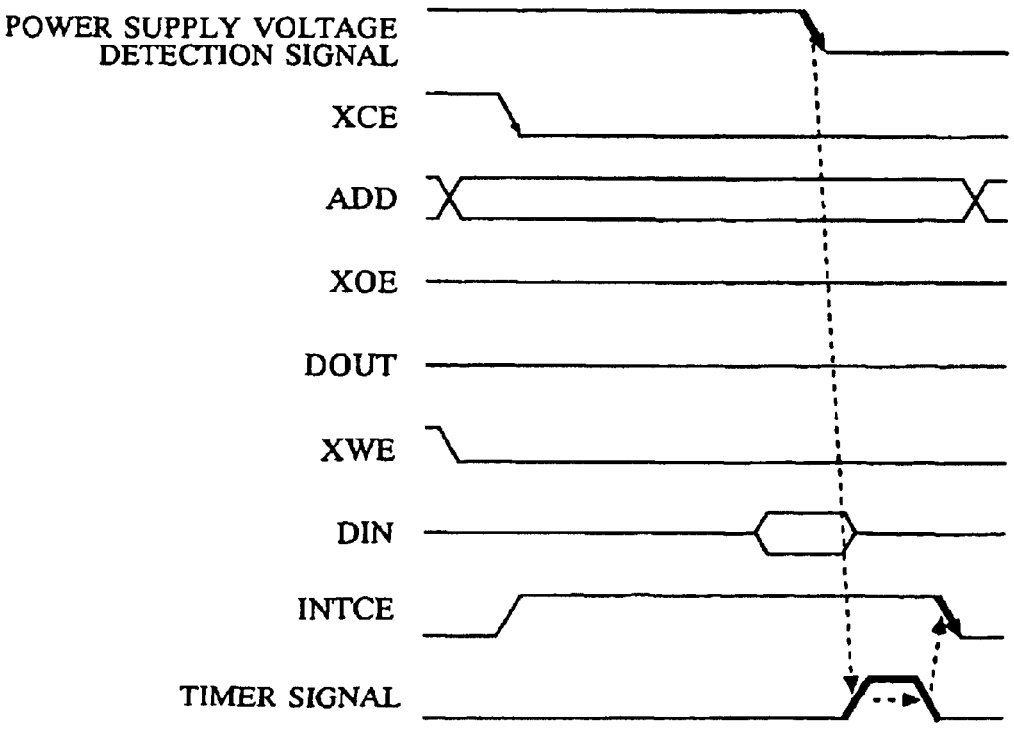
FIG. 7B is a timing chart illustrating a write-in operation of the semiconductor memory device shown in FIG. 6.

FIGS. 7A and 7B are timing charts of the semiconductor memory device shown in FIG. 6. In the semiconductor memory device shown in FIG. 6, when the power supply voltage is reduced to equal to or lower than the certain value during a read-out operation (FIG. 7A) or a write-in operation (FIG. 7B), the power supply voltage detection signal performs an "L" transition, and the rewrite timer 7 is activated in synchronization with the "L" transition of the power supply voltage detection signal. By activating the rewrite timer 7 with such a timing to rewrite data, a data protection in the case of the power supply voltage reduction is performed.

Figure 8:
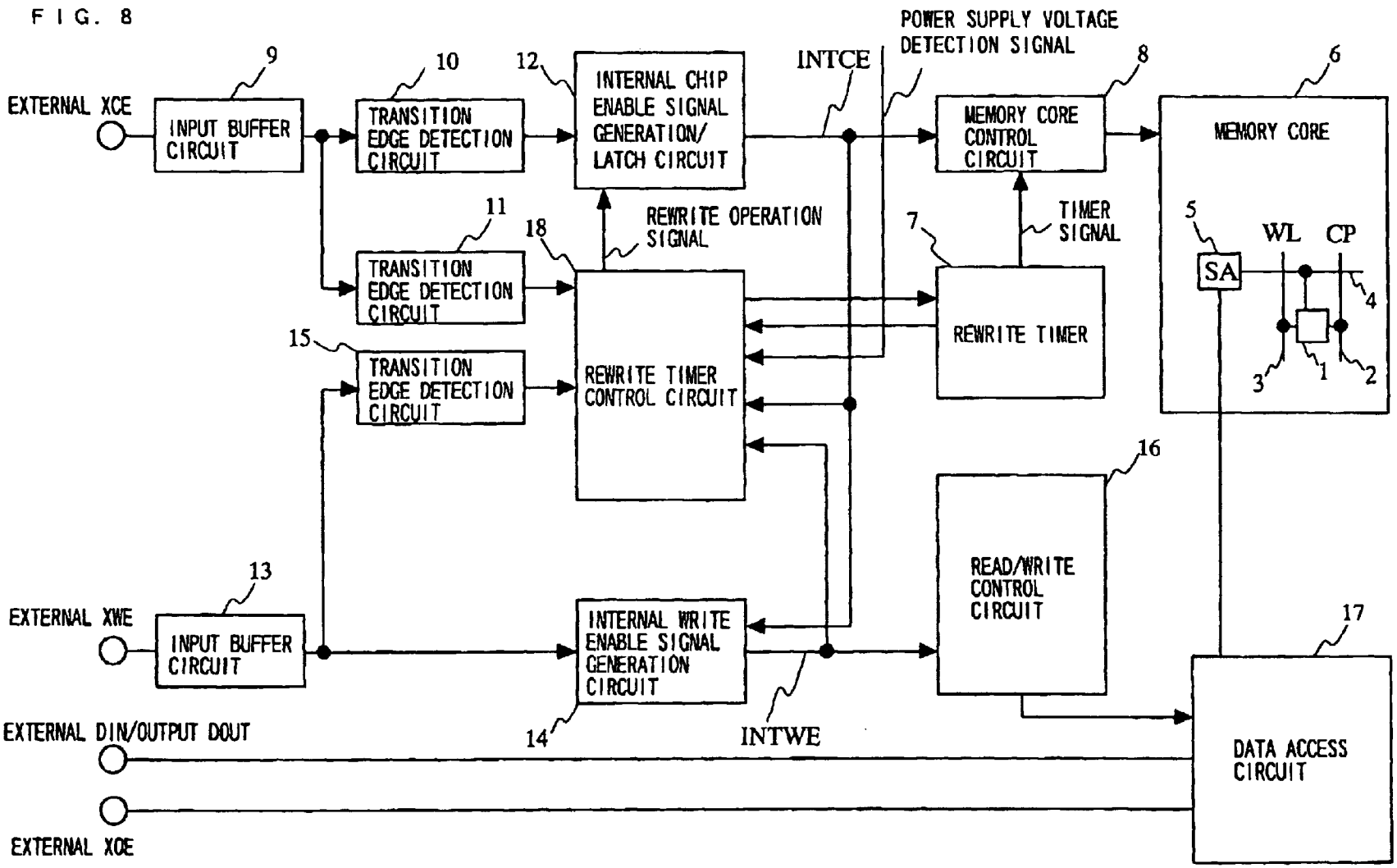
FIG. 8 is a still alternative configuration diagram of the semiconductor memory device according to the first embodiment of the present invention.

A configuration of the semiconductor memory device configured in consideration of the power supply voltage reduction for the semiconductor memory device shown in FIG. 4 is illustrated in FIG. 8. The difference between the semiconductor memory device shown in FIG. 4 and that shown in FIG. 8 is that, in the semiconductor memory device shown in FIG. 8, the power supply voltage detection signal is inputted to the rewrite timer control circuit 18.

Figure 9:
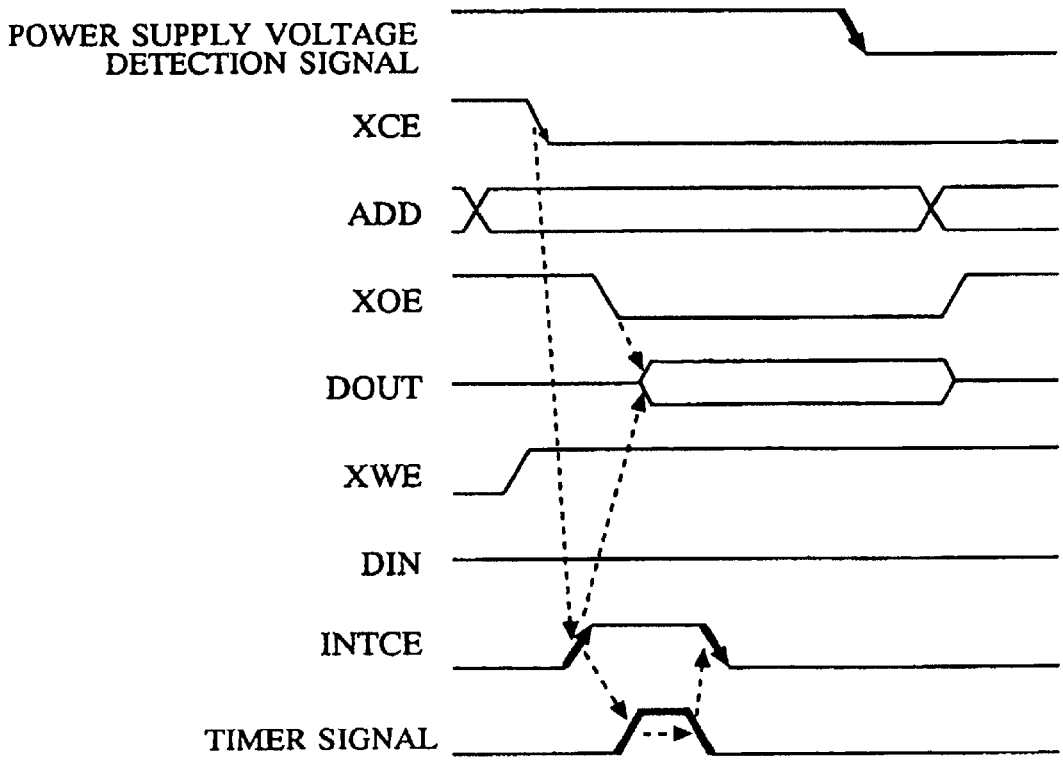
FIG. 9 is a timing chart illustrating a read-out operation of the semiconductor memory device shown in FIG. 8.

FIG. 9 is a timing chart illustrating a read-out operation of the semiconductor memory device shown in FIG. 8. In the semiconductor memory device shown in FIG. 8, when the power supply voltage is reduced to equal to or lower than the certain value during a read-out operation, a rewrite is performed in synchronization with the internal chip enable signal INTCE, as shown in FIG. 9, and not in synchronization with a transition of the power supply voltage detection signal. In a write-in operation, on the other hand, a rewrite is performed in synchronization with the "L" transition of the power supply voltage detection signal in a similar manner as performed in the semiconductor memory device shown in FIG. 6. A timing chart of the semiconductor memory device shown in FIG. 8 for a write-in operation is similar to that shown in FIG. 7B, and therefore, a detailed description thereof is omitted.

Figure 10:
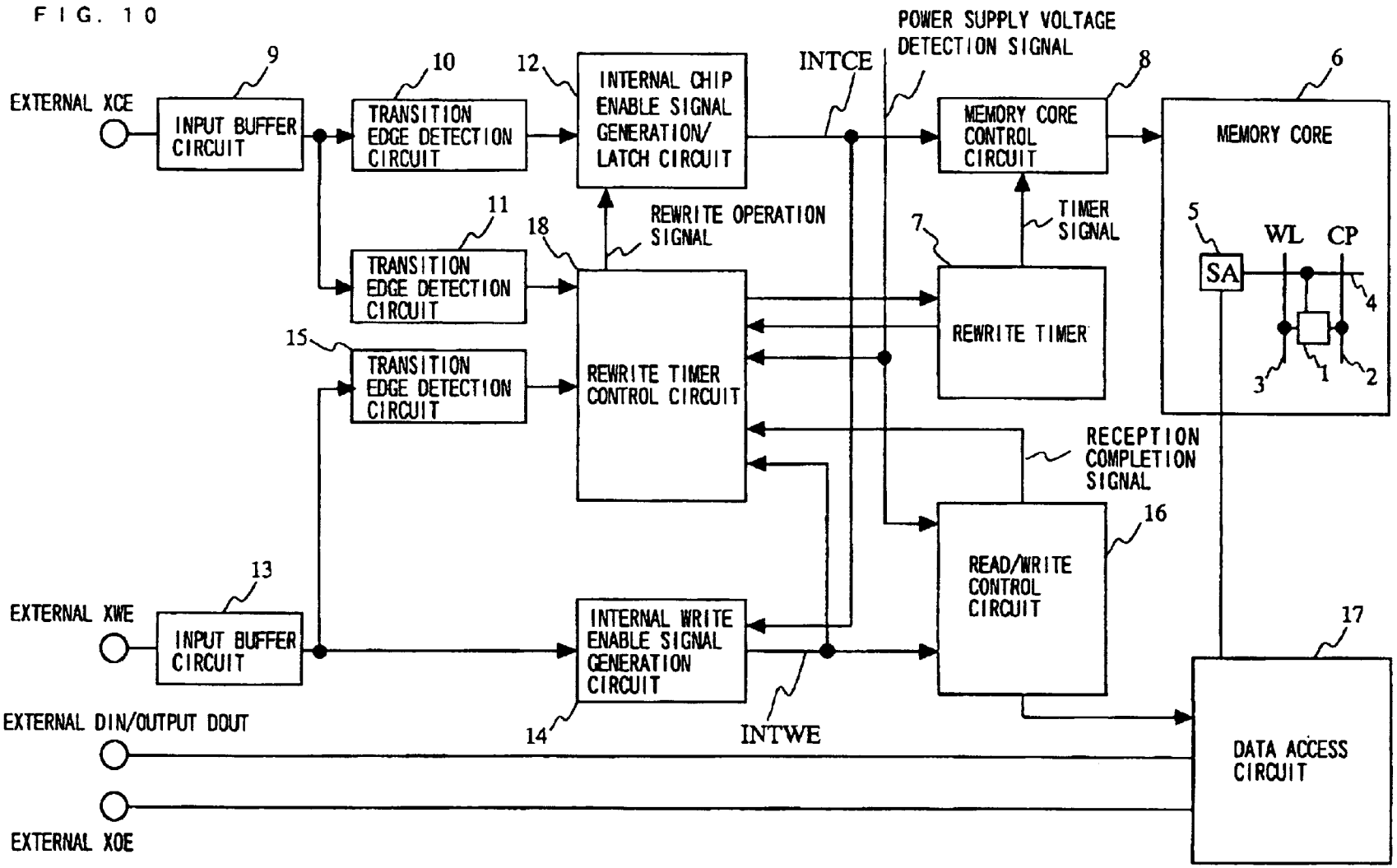
FIG. 10 is a still alternative example of the semiconductor memory device according to the first embodiment of the present invention.

The semiconductor memory device of the present embodiment may be configured as shown in FIG. 10. The difference between the semiconductor memory device shown in FIG. 6 and that shown in FIG. 10 is that, in the semiconductor memory device of FIG. 10, a reception completion signal is outputted from the read/write control circuit 16 to the rewrite timer control circuit 18. The reception completion signal is outputted, during a write-in operation, after an external input data signal DIN is transferred to the bit line 4 via the sense amplifier 5.

Figure 11:
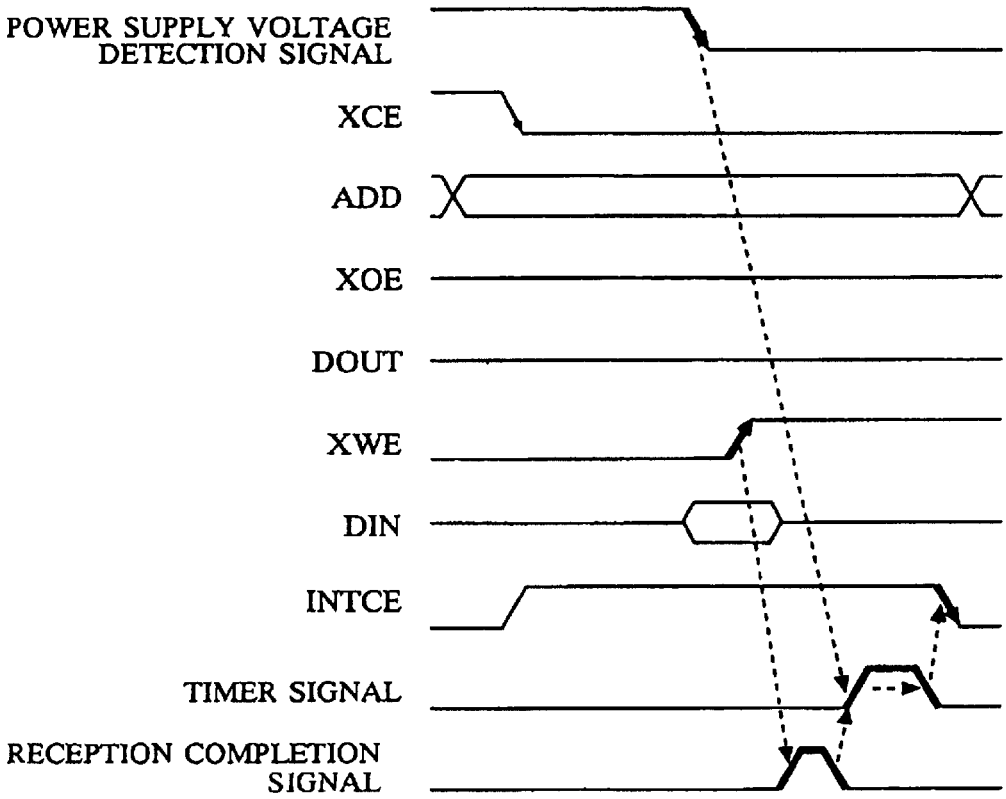
FIG. 11 is a timing chart illustrating a write-in operation of the semiconductor memory device shown in FIG. 10.

FIG. 11 is a timing chart illustrating a write-in operation performed by the semiconductor memory device shown in FIG. 10. If, while data is being received from an external source, the power supply voltage is reduced to equal to or lower than the certain value and the power supply voltage detection signal performs an "L" transition, the semiconductor memory device shown in FIG. 10 receives the data into the sense amplifier 5, transfers the data from the sense amplifier 5 to the bit line 4, and then outputs the reception completion signal to the rewrite timer control circuit 18 for activating the rewrite timer 7. By performing a rewrite after data is transferred to the bit line 4 as described above, reliability in data retention can be enhanced.

In all of the examples of the semiconductor memory device of the present embodiment, a rewrite operation is internally completed, and an external signal is not inputted during the rewrite because, when the rewrite operation is started, a rewrite operation signal is outputted from the rewrite timer control circuit 18 to the internal chip enable signal generation/latch circuit 12, and the internal chip enable signal generation/latch circuit 12 thereby stops receiving an external signal. As such, the rewrite operation can be prevented from being interrupted due to noise contained in an external input signal, thereby allowing to ensure a sufficient time for the rewrite. Accordingly, reliability in data retention in the semiconductor memory device can be enhanced.

As described above, the semiconductor memory device of the present embodiment is a semiconductor memory device which is compatible with an input/output scheme used by an asynchronous SRAM, and which activates, during or after a data read-out operation, or otherwise after a data write-in operation, the rewrite timer 7 for performing a data rewrite for the memory cell 1. By using the above-described method for a data rewrite, the semiconductor memory device of the present embodiment can ensure a sufficient time for the rewrite operation, whereby reliability in data retention can be enhanced. Also, by using a power supply voltage detection signal, the semiconductor memory device of the present embodiment activates the rewrite timer 7 for performing a data rewrite. Accordingly, the data rewrite is performed before a power supply voltage is reduced to equal to or lower than a certain value, thereby protecting data in a case of a power supply voltage reduction.

Also, in the semiconductor memory device of the present embodiment, a ferroelectric memory is employed for a memory core, thereby being compatible with a SRAM and still enabling to provide a semiconductor memory device more highly integrated than the SRAM.

Second Embodiment

Figure 12:
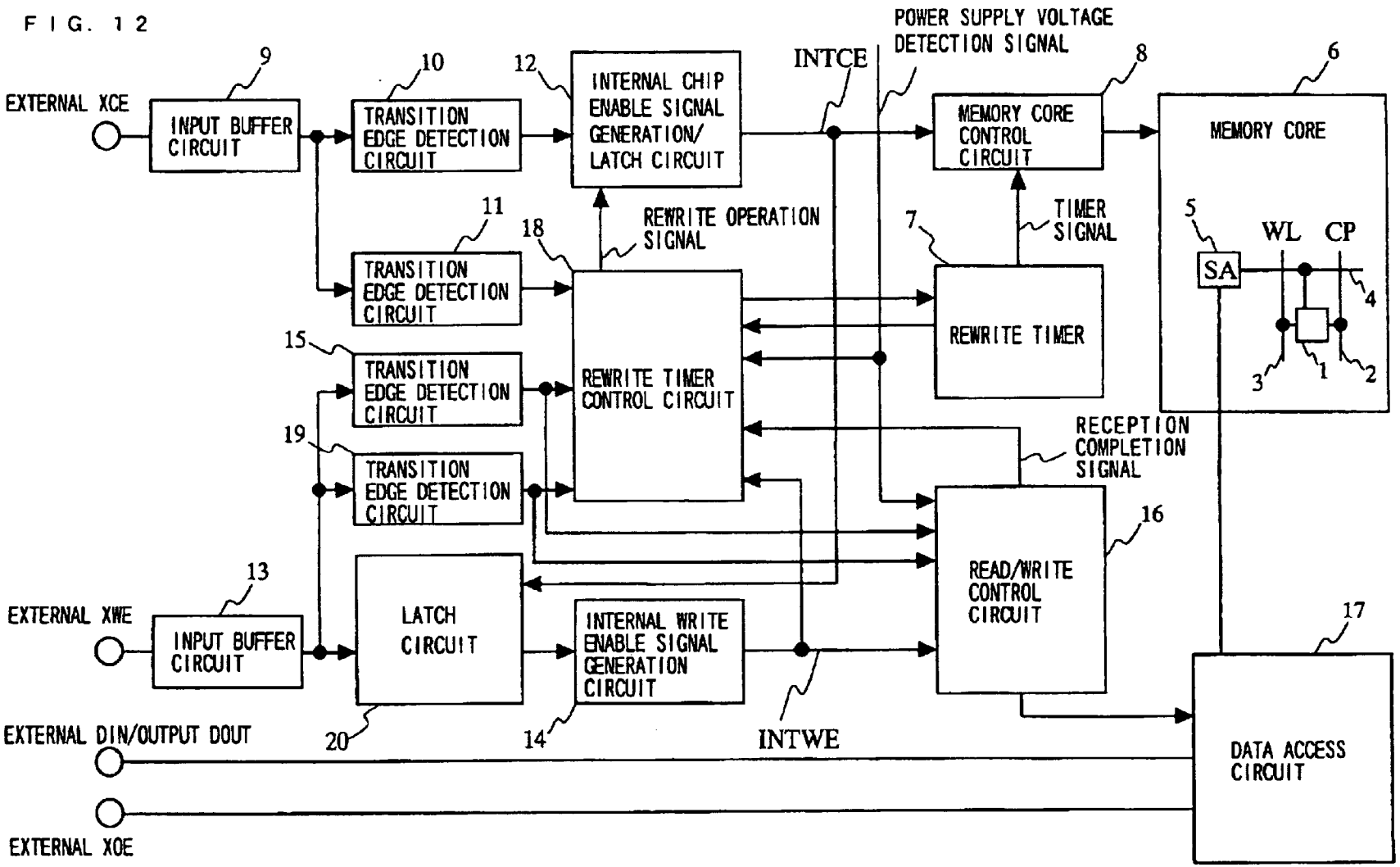
FIG. 12 is a configuration diagram of a semiconductor memory device according to a second embodiment of the present invention.

Hereinafter, a semiconductor memory device according to a second embodiment of the present invention is described with reference to the drawings. FIG. 12 is a diagram illustrating a configuration of the semiconductor memory device of the present embodiment.

The semiconductor memory device of the present embodiment is a semiconductor memory device, of the first embodiment, shown in FIG. 10, having a transition edge detection circuit 19 and a latch circuit 20 added thereto. The transition edge detection circuit 19 detects a falling transition of an external write enable signal XWE. The latch circuit 20 receives and retains the external write enable signal XWE.

Figure 13:
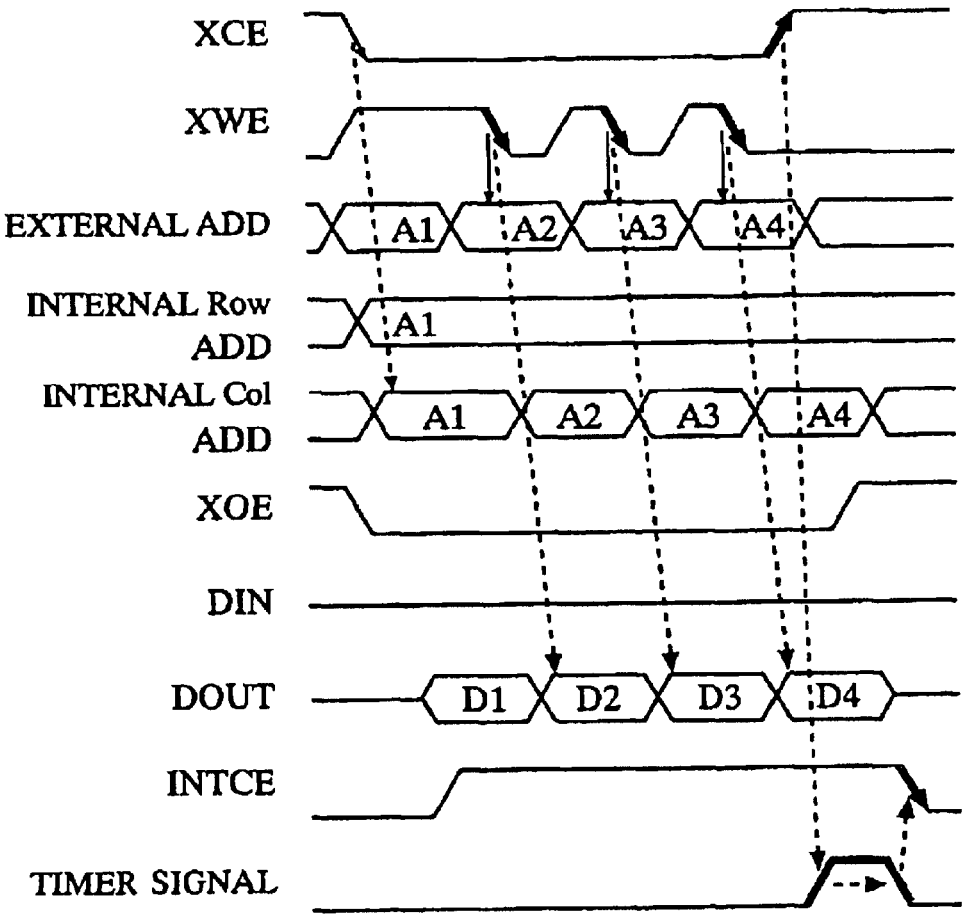
FIG. 13 is a timing chart illustrating a read-out operation of the semiconductor memory device shown in FIG. 12.
Figure 14:
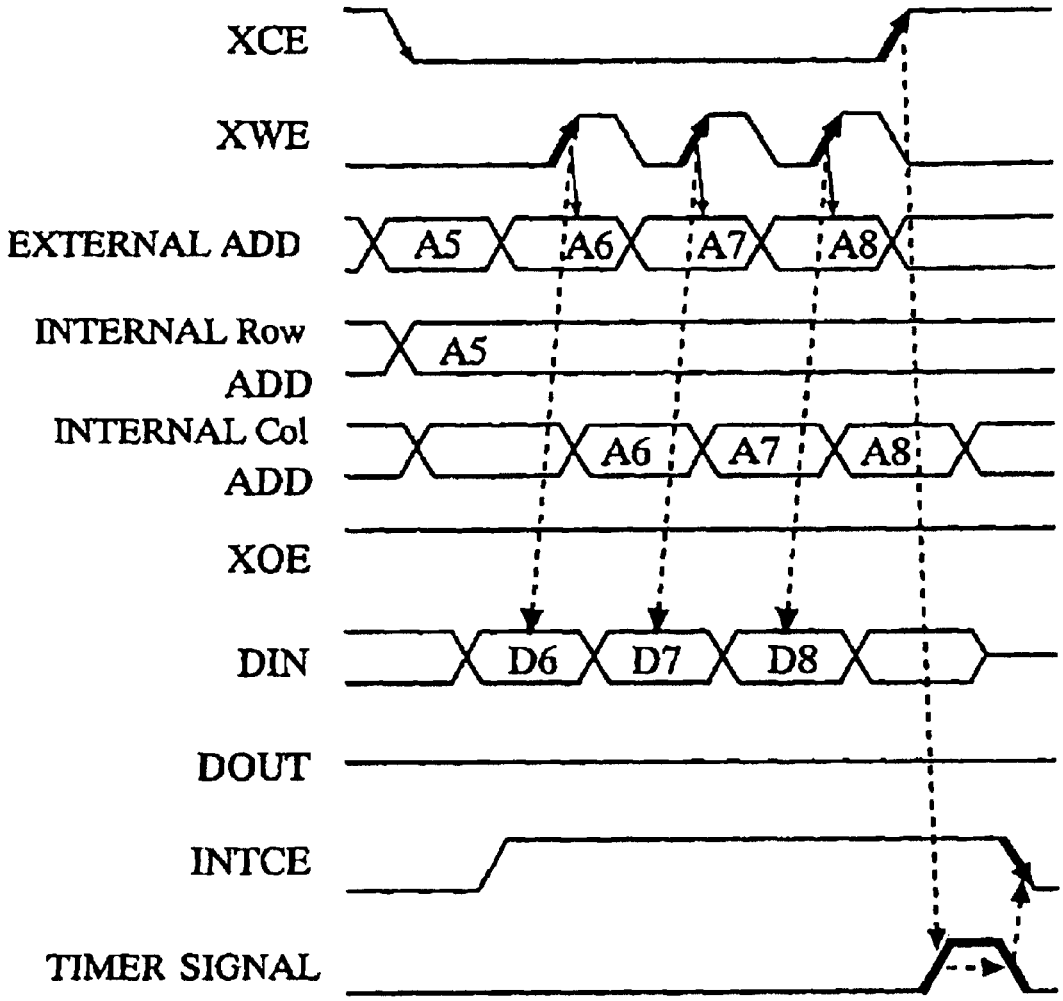
FIG. 14 is a timing chart illustrating a write-in operation of the semiconductor memory device shown in FIG. 12.

Hereinafter, an operation of the semiconductor memory device according to the present embodiment is described with reference to the drawings. FIGS. 13 and 14 are timing charts respectively illustrating a read-out and a write-in operation of the semiconductor memory device of the present embodiment.

In the semiconductor memory device of the present embodiment, a data read and a data write are performed as follows. When the transition edge detection circuit 10 detects an "L" transition of an external chip enable signal XCE, the internal chip enable signal generation/latch circuit 12 generates an internal chip enable signal INTCE, and outputs the internal chip enable signal INTCE to the memory core control circuit 8. The memory core control circuit 8 is activated when the internal chip enable signal INTCE is inputted, and prepares to access to the memory core 6.

Also, the semiconductor memory device of the present embodiment receives the external write enable signal XWE in synchronization with the "L" transition of the external chip enable signal XCE, and retains the received external write enable signal XWE in the latch circuit 20.

In the semiconductor memory device of the present embodiment, it is determined whether a read-out or a write-in operation is to be performed based on the level of the external write enable signal XWE stored, in the latch circuit 20, in synchronization with the "L" transition of the external chip enable signal XCE. The operation determined in the above remains unchanged until the external chip enable signal XCE takes on an "H" level. In other words, either the read-out or the write-in operation determined in the above does not change according to subsequent transitions of the external write enable signal XWE unless the external chip enable signal XCE takes on an "H" level.

Also, the semiconductor memory device of the present embodiment receives row address A1 in an external address signal (external ADD) in synchronization with the "L" transition of the external chip enable signal XCE, and accesses to the memory core 6 via the read/write control circuit 16 and the data access circuit 17.

Thereafter, the semiconductor memory device of the present embodiment performs the data read-out or the data write-in in synchronization with transitions of the external write enable signal XWE. Hereinafter, these operations are described.

In the read-out operation, in synchronization with "L" transitions of the external write enable signal XWE, column addresses A2 to A4 in the external address signal are respectively received (see FIG. 13). On the other hand, in the write-in operation, in synchronization with "H" transitions of the external write enable signal XWE, column addresses A6 to A8 and external input data signals D6 to D8 (DIN) are respectively received (see FIG. 14).

Also, in the read-out operation, the word line 3 is designated based on the received row address, and data is initially readout, to the sense amplifier 5, from the memory cell 1 connected to the designated word line 3. Thereafter, in synchronization with the "L" transitions of the external write enable signal XWE, data D2 to D4 in the memory cells 1 respectively corresponding to the column addresses are respectively read out from the sense amplifier 5 (DOUT in FIG. 13).

Also, in the write-in operation, the word line 3 is designated based on the received row address, and thereafter, in synchronization with "H" transitions of the external write enable signal XWE, the external input data D6 to D8 (DIN) are respectively written to the memory cells 1 respectively corresponding to the column addresses.

As described above, the semiconductor memory device of the present embodiment receives the external write enable signal XWE to the latch circuit 20 in synchronization with the "L" transition of an external chip enable signal XCE, retains the received external write enable signal XWE, and performs either a read-out or write-in operation corresponding to the level of the retained external write enable signal XWE until the external chip enable signal XCE takes on an "H" level. Also, in the read-out operation, the semiconductor memory device of the present embodiment reads data in synchronization with the "L" transition of the external write enable signal XWE, and, in the write-in operation, on the other hand, writes data in synchronization with the "H" transition of the external write enable signal XWE. Accordingly, a high speed input/output of data can be performed.

Also, subsequent to the read-out or the write-in operation, a rewrite operation for the memory cell 1 is performed by activating the rewrite timer 7 synchronous to the "H" transition of the external chip enable signal XCE. Thereafter, with a completion of the operation of the rewrite timer 7, the rewrite for the memory cell 1 ends, and the internal chip enable signal generation/latch circuit 12 inactivates the internal chip enable signal INTCE to end the chip operation.

Figure 15:
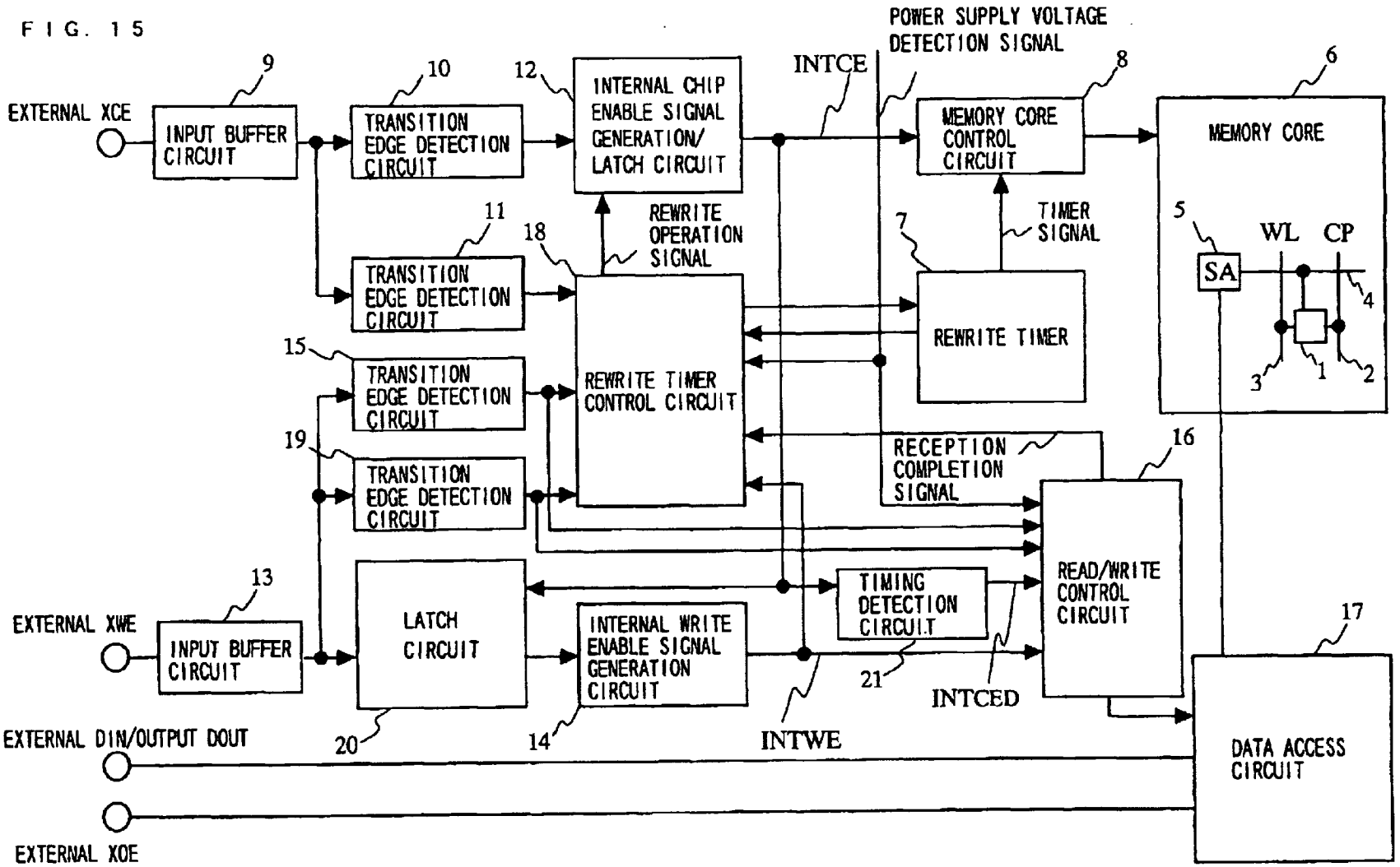
FIG. 15 is an alternative configuration diagram of the semiconductor memory device according to the second embodiment of the present invention.

Next, an alternative example of the semiconductor memory device according to the present embodiment is described. FIG. 15 is an alternative example of the semiconductor memory device according to the present embodiment. The semiconductor memory device shown in FIG. 15 is the semiconductor memory device, of FIG. 12, having a timing detection circuit 21 added thereto.

Feature of the semiconductor memory device shown in FIG. 15 is that the semiconductor memory device allows to switch between a high-speed data input/output operation in synchronization with an external write enable signal XWE and an internal completion operation in synchronization with an external chip enable signal XCE. More specifically, when a certain period of time is elapsed from the "L" transition of the external chip enable signal XCE, an INTCED signal is outputted from the timing detection circuit 21 to the read/write control circuit 16, and then an operation to be performed by the semiconductor memory device shown in FIG. 15 is determined.

Here, the internal completion operation is to complete a chip operation by performing, when a certain period of time is elapsed from a start of an operation caused by the "L" transition of the external chip enable signal XCE, a rewrite operation regardless of types of an external input signal.

Figure 16A:
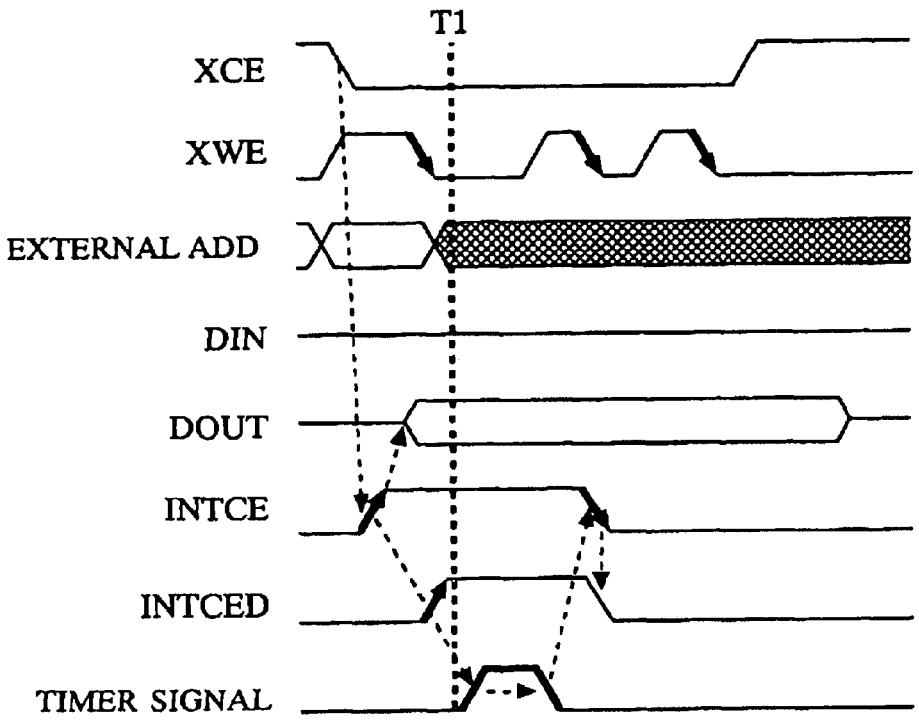
FIG. 16A is a timing chart illustrating a read-out operation of the semiconductor memory device shown in FIG. 15.
Figure 16B:
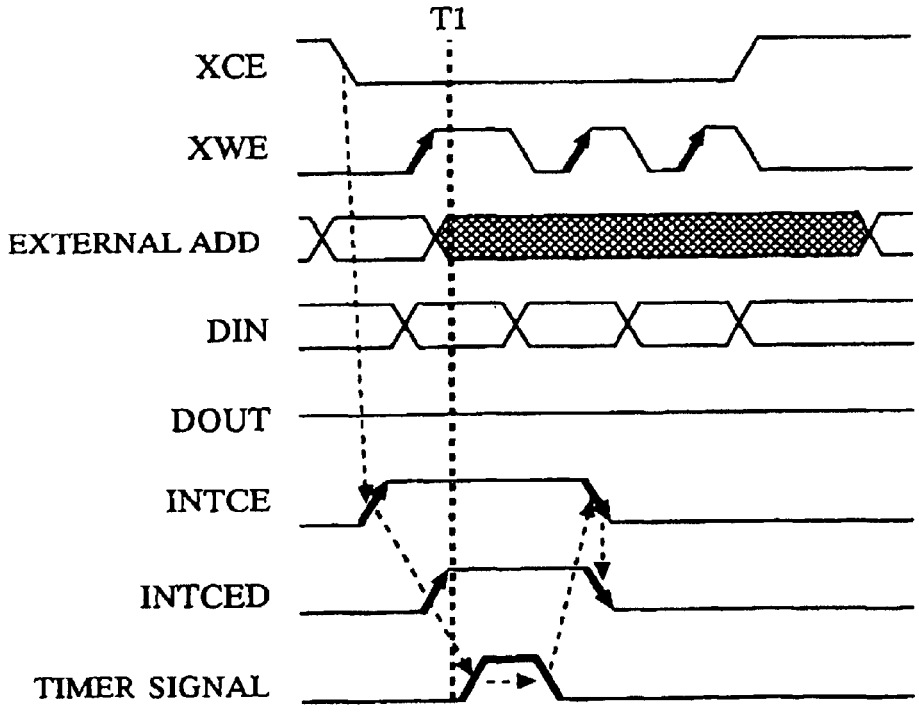
FIG. 16B is a timing chart illustrating a write-in operation of the semiconductor memory device shown in FIG. 15.

FIGS. 16A and 16B are timing charts each illustrating a read-out or a write-in operation of the semiconductor memory device shown in FIG. 15. FIG. 16 shows that an INTCED signal is outputted from the timing detection circuit 21 when a time period of T1 is elapsed from the "L" transition of the external chip enable signal XCE. Here, the time period of T1 is set in accordance with internal timing such as a start time of the sense amplifier 5, for example.

The semiconductor memory device shown in FIG. 15 in a read-out operation can perform the internal completion operation by performing an "L" transition for the external write enable signal XWE within the time period of T1 from the "L" transition of the external chip enable signal XCE, as shown in FIG. 16A.

Also, the semiconductor memory device shown in FIG. 15 in a write-in operation can perform the internal completion operation by performing, within the time period of T1 from the "L" transition of the external chip enable signal XCE, an "H" transition for the external write enable signal XWE, as shown in FIG. 16B.

Also, a rewrite operation subsequent to the read-out or the write-in operation is performed by activating the rewrite timer 7 in synchronization with an internal chip enable signal INTCE. The rewrite timer 7 may be provided with a timer circuit dedicated for a rewrite, or a timer circuit used in the internal completion operation may be used as the rewrite timer 7.

Figure 17A:
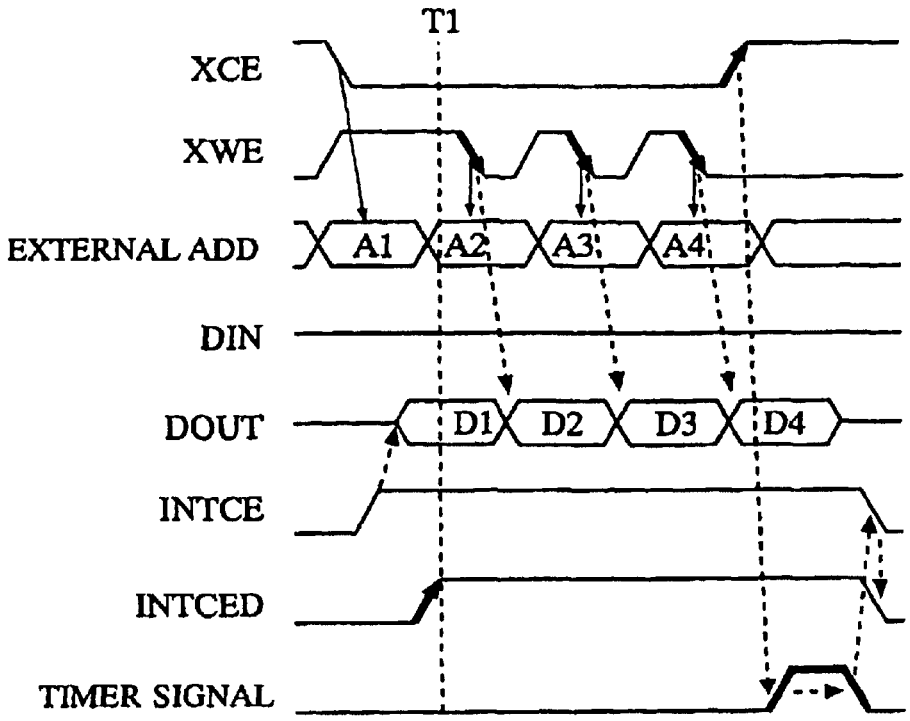
FIG. 17A is a timing chart illustrating an alternative read-out operation of the semiconductor memory device shown in FIG. 15.
Figure 17B:
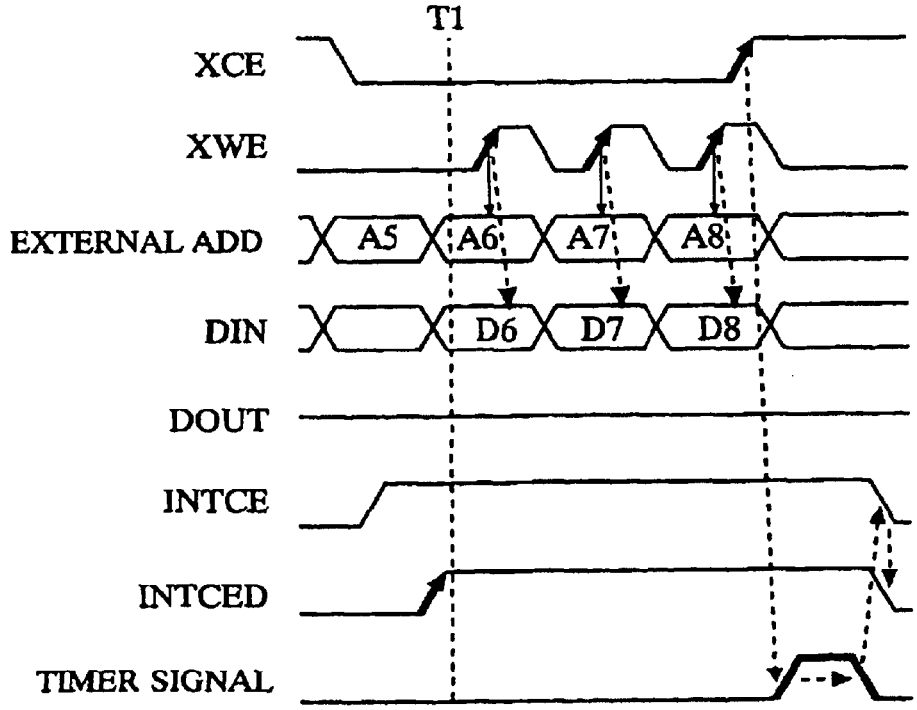
FIG. 17B is a timing chart illustrating an alternative write-in operation of the semiconductor memory device shown in FIG. 15.

Also, the semiconductor memory device shown in FIG. 15 can perform a high-speed data input/output operation by performing a transition for the external write enable signal XWE after the time period of T1 from the "L" transition of the external chip enable signal XCE, as shown in FIGS. 17A and 17B. The operation is similar to the operation of the semiconductor memory device shown in FIG. 12, and therefore, a description thereof is omitted.

Figure 18:
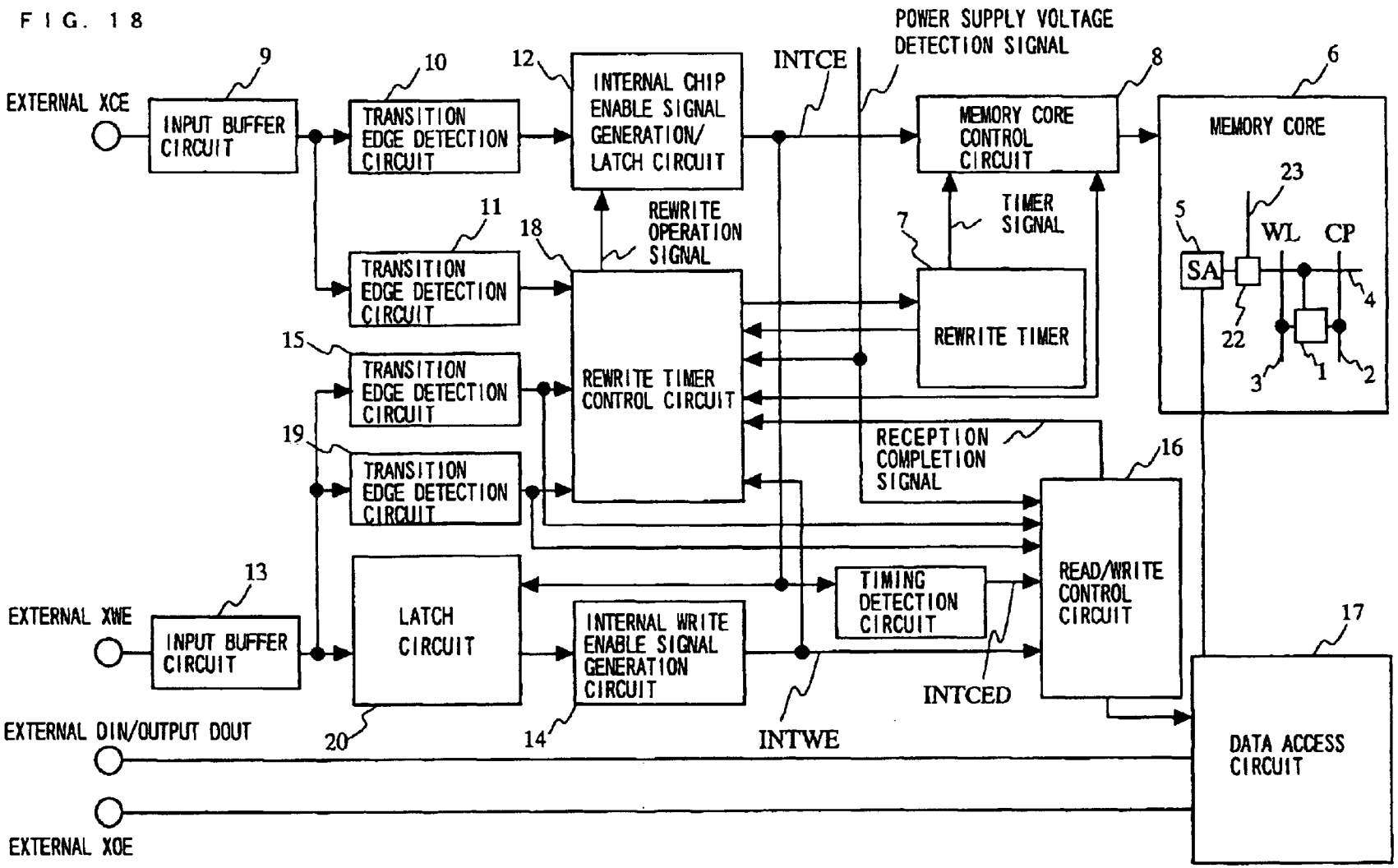
FIG. 18 is a still alternative configuration diagram of the semiconductor memory device according to the second embodiment of the present invention.

The semiconductor memory device of the present embodiment may be configured as shown in FIG. 18. The difference between the semiconductor memory device shown in FIG. 18 and that shown in FIG. 15 is that, in the semiconductor memory device of FIG. 18, a switch 22 is provided between the bit line 4 and the sense amplifier 5. The switch 22 opens and closes according to a control signal 23 outputted from the memory core control circuit 8.

Feature of the semiconductor memory device shown in FIG. 18 is that, after data is received from the memory cell 1 into the sense amplifier 5 by closing of the switch 22, the memory cell 1 and the sense amplifier 5 are disconnected by opening the switch 22.

In the semiconductor memory device shown in FIG. 18 in a read-out operation, by opening of the switch 22, load applied to the bit line 4 can be reduced, whereby a signal on the bit line 4 performs transitions faster than that of a case where no switch is provided. Accordingly, a high-speed read-out operation is enabled. Also, in a write-in operation, through the reduction in the load applied to the bit line 4, the amount of load for charging and discharging during rewriting data is reduced, and thereby reducing charging and discharging electric current and allowing a high-speed rewrite.

Further, through disconnecting between the memory cell 1 and the sense amplifier 5 by using the switch 22, only last data to be rewritten is written to the memory cell 1, and thereby reducing the number of data rewrites for the memory cell. Accordingly, a deterioration of the memory cell can be suppressed.

The data rewrite for the memory cell 1 is performed by opening the switch 22 according to the control signal 23 and by activating the rewrite timer 7 in a similar manner as performed in the read-out operation and the write-in operation.

Figure 19A:
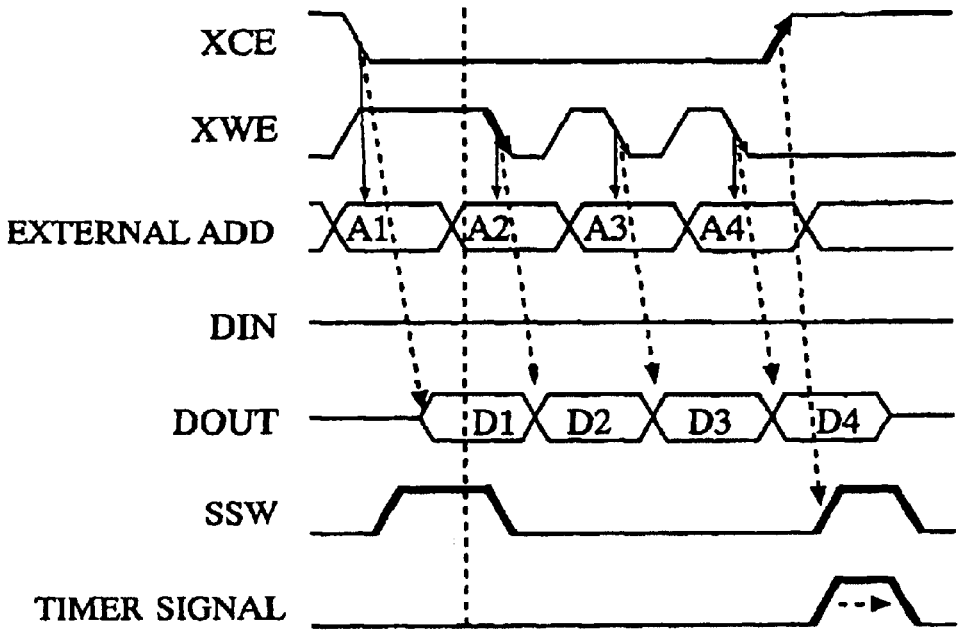
FIG. 19A is a timing chart illustrating a read-out operation of the semiconductor memory device shown in FIG. 18.
Figure 19B:
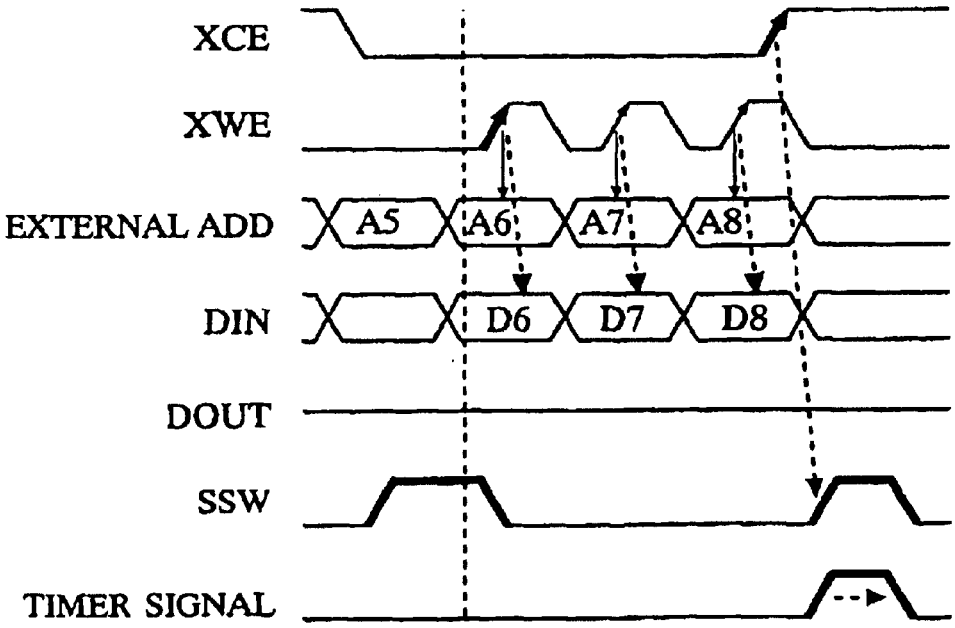
FIG. 19B is a timing chart illustrating a write-in operation of the semiconductor memory device shown in FIG. 18.
Figure 20:
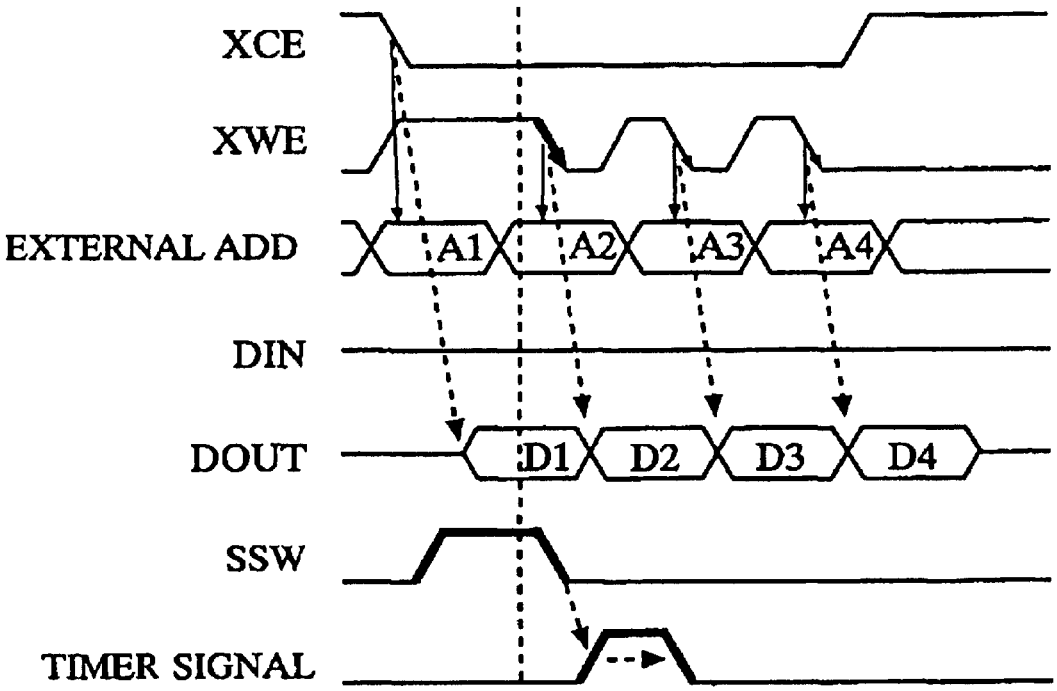
FIG. 20 is a timing chart illustrating a read-out operation of the semiconductor memory device shown in FIG. 18.
Figure 21:
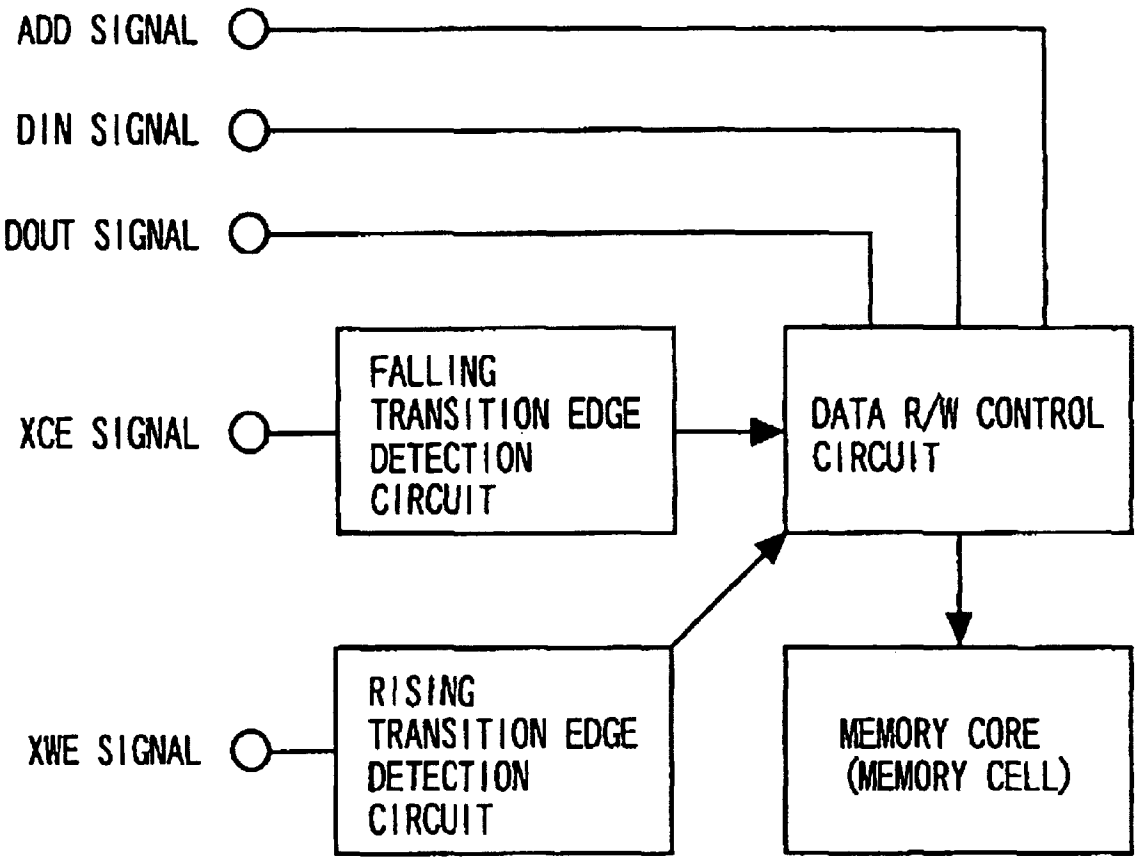
FIG. 21 is a configuration diagram of a conventional pseud-SRAM.
Figure 22:
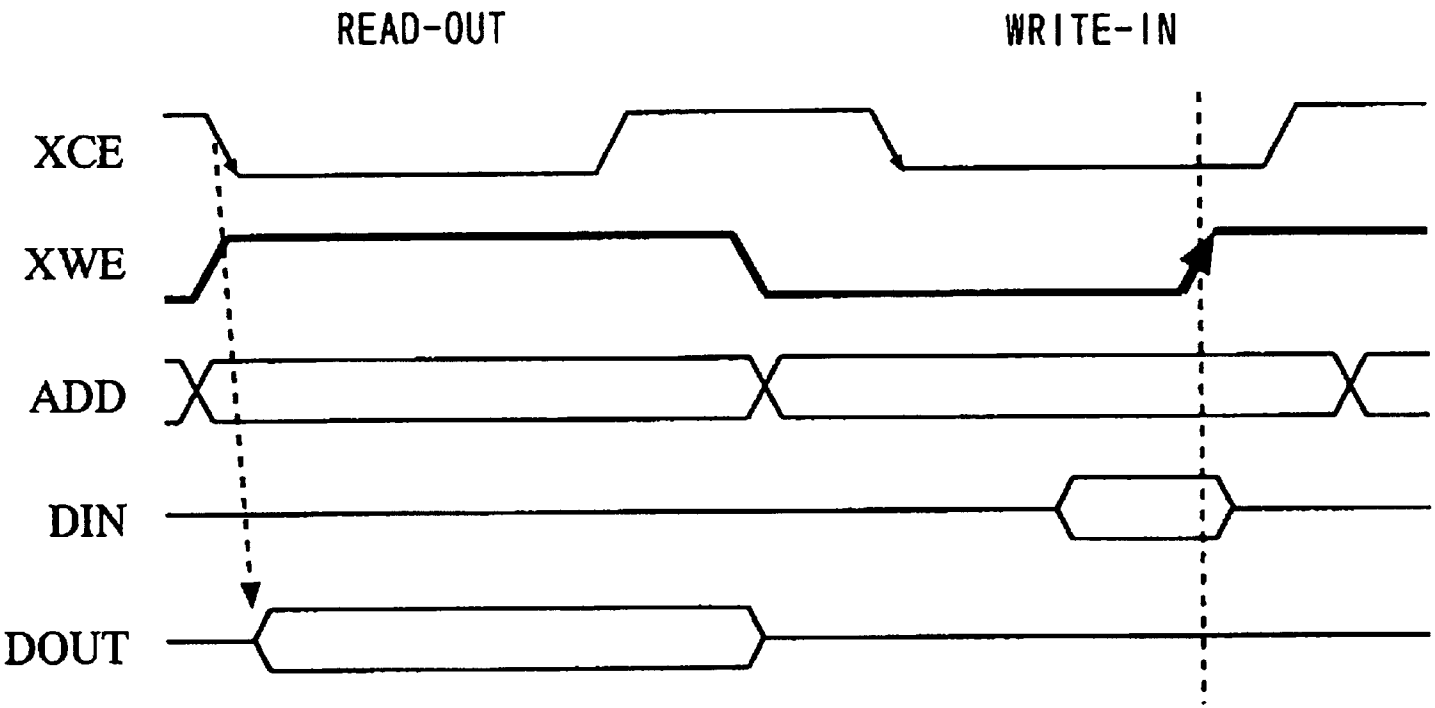
FIG. 22 is a timing chart illustrating an operation of the pseud-SRAM shown in FIG. 21.
Figure 23:
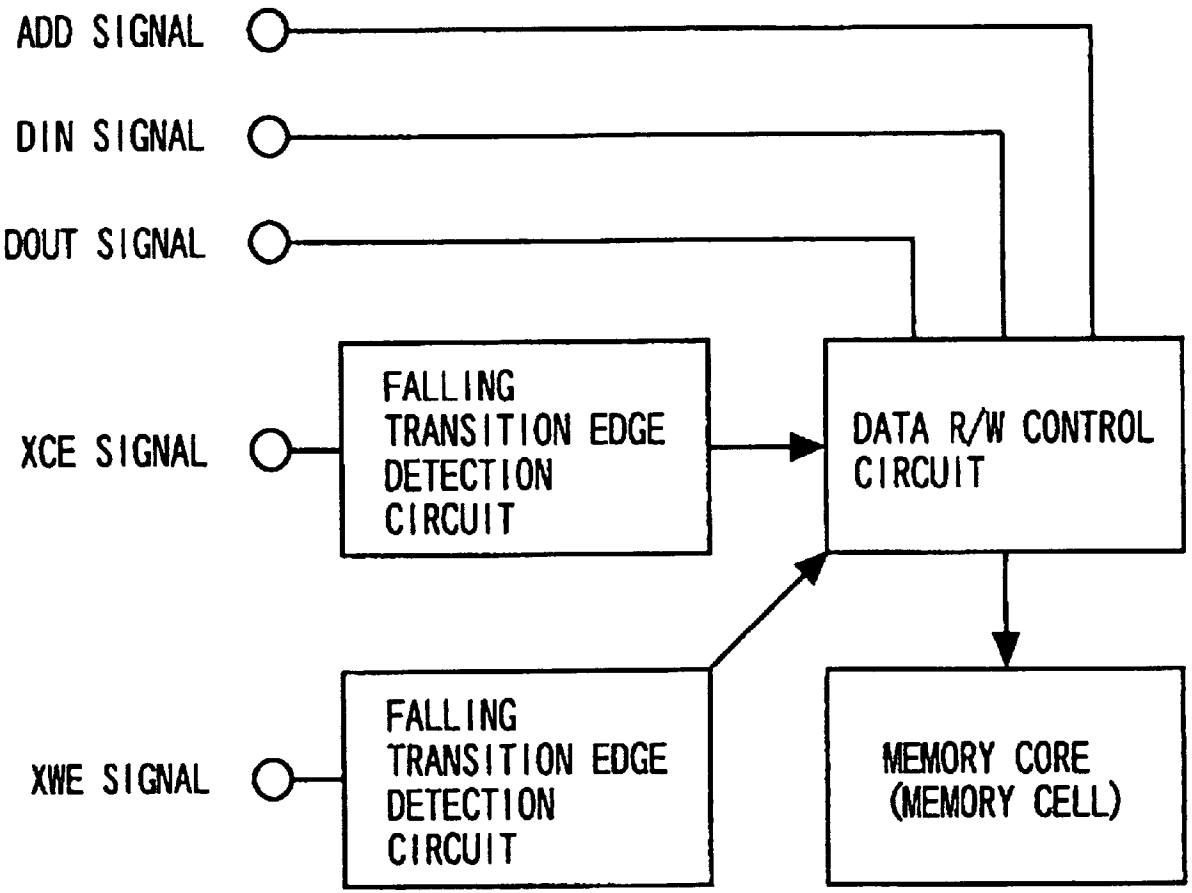
FIG. 23 is a configuration diagram of a conventional pseud-SRAM.
Figure 24:
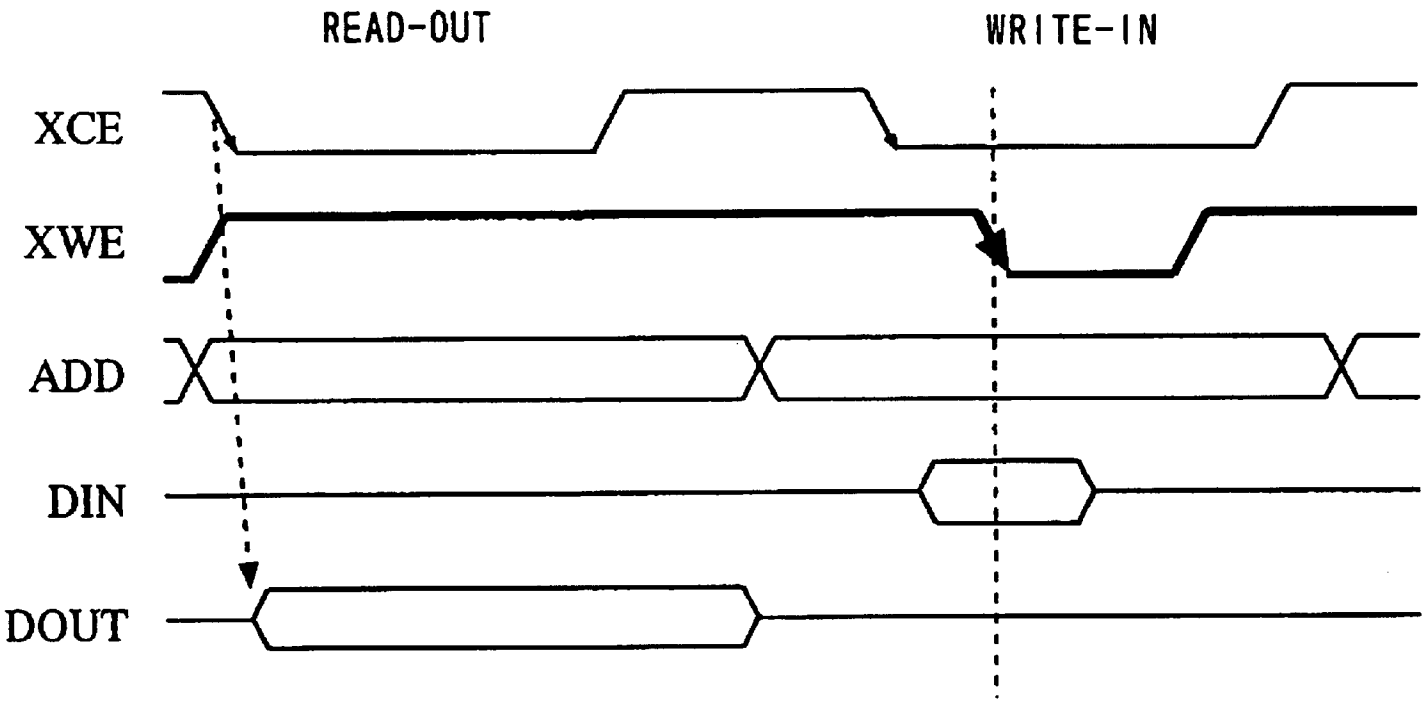
FIG. 24 is a timing chart illustrating an operation of the pseud-SRAM shown in FIG. 23.
Figure 25:
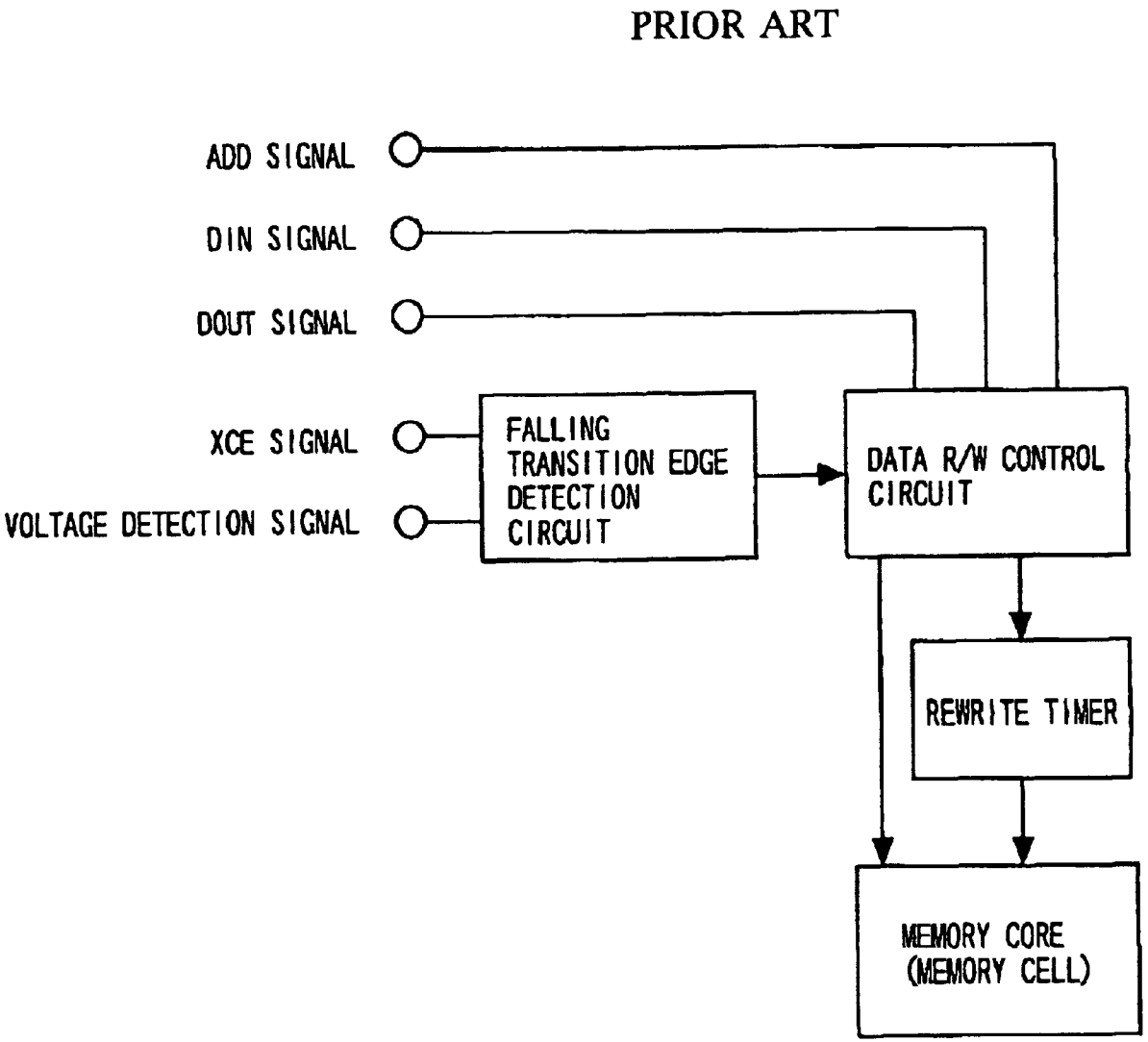
FIG. 25 is a configuration diagram of a conventional pseud-SRAM.
Figure 26:
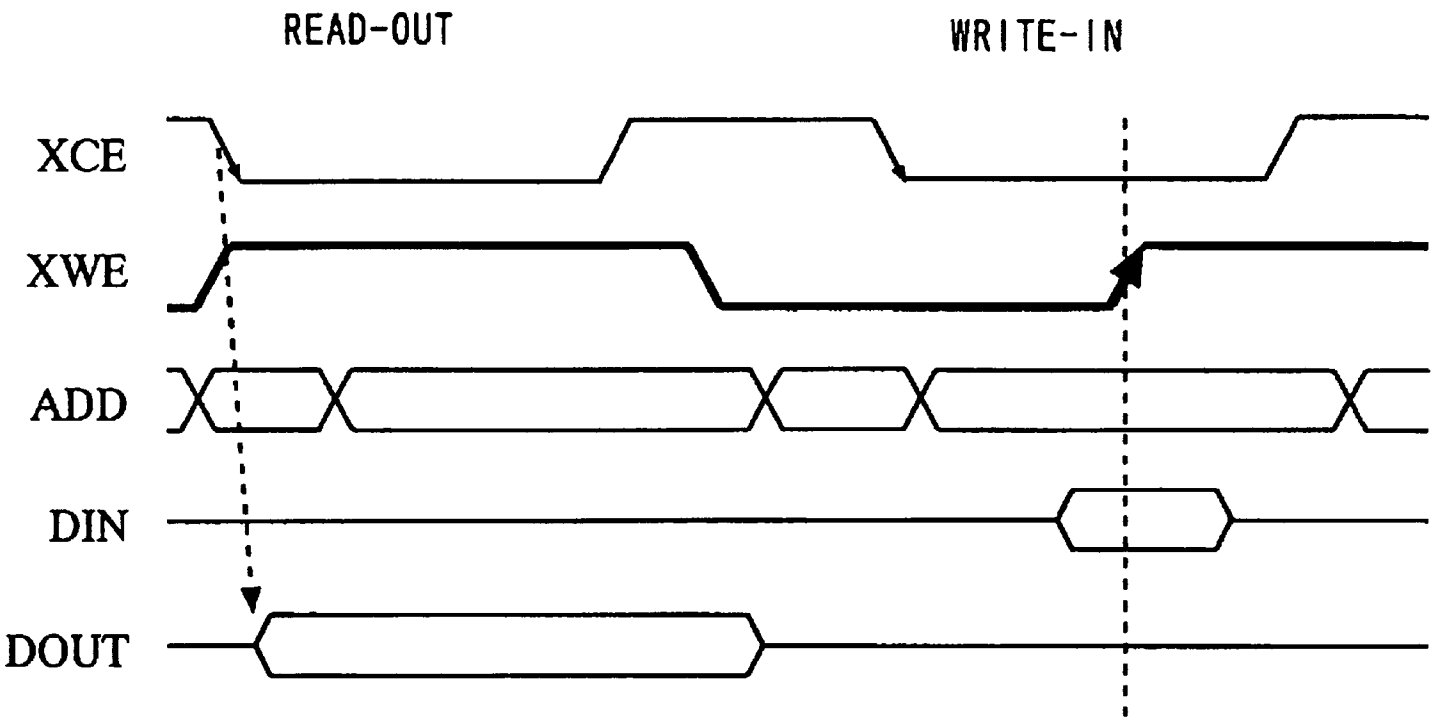
FIG. 26 is a timing chart illustrating an operation of the pseud-SRAM shown in FIG. 25.

FIGS. 19A and 19B are timing charts illustrating operations of the semiconductor memory device shown in FIG. 18. FIG. 19A illustrates a read-out operation of the semiconductor memory device shown in FIG. 18, and FIG. 19B illustrates a write-in operation of the semiconductor memory device shown in FIG. 18. Also, FIG. 20 is a timing chart illustrating an alternative example of the read-out operation of the semiconductor memory device shown in FIG. 18.

In a read-out operation, the semiconductor memory device shown in FIG. 18 receives the row address A1 in an external address signal (external ADD) in synchronization with the "L" transition of the external chip enable signal XCE. Subsequently, in synchronization with "L" transitions of the external write enable signal XWE, the semiconductor memory device respectively receives the column addresses A2 to A4 in the external address signal (see FIGS. 19A and 20). In synchronization with the "L" transitions of the external write enable signal XWE, the semiconductor memory device respectively reads out the data D2 to D4 from the memory cells 1 respectively corresponding to the column addresses via the sense amplifier 5 (DOUT in FIG. 19A).

Also, in a write-in operation, in synchronization with the "H" transitions of the external write enable signal XWE, the semiconductor memory device respectively receives the column addresses A6 to A8 in the external signal and the external input data signals D6 to D8 (DIN) (see FIG. 19B).

A rewrite operation to the memory cell 1 is performed by opening ("H" transition of SSW) of the switch 22 in synchronization with an "H" transition of an external chip enable signal XCE, and further, by activating the rewrite timer 7, as shown in FIGS. 19A and 19B.

Alternatively, in the alternative example of the read-out operation, the rewrite operation to the memory cell 1 may be performed by opening ("L" transition of the SSW) the switch 22 and activating the rewrite timer 7 after data is read out ("H" transition of the SSW) from the memory cell 1 and outputted to the sense amplifier 5. In this case, a cycle time can be shortened compared to the time taken in the operation shown in FIG. 19A.

As described above, the semiconductor memory device according to the present embodiment performs data read-out and write-in operations in synchronization with an external write enable signal XWE used in a SRAM, thereby allowing a high-speed data input/output.

Note that a signal to synchronize in a data read-out or data write-in is not limited to the external write enable signal XWE. Other input signals such as an external output enable signal XOE may be used instead of the external write enable signal XWE.

Also, in the semiconductor memory device according to the first and the second embodiments, a ferroelectric memory is used for a memory core, but a DRAM may be used for the memory core.

Also, the logic may be reversed for all signals. In other words, in the above description and the drawings, "H" may be changed to "L", and "L" may be changed to "H", and still similar operations can be performed and similar effects can be obtained.

Also, the internal chip enable signal INTCE may be delayed by the internal chip enable signal generation/latch circuit 12.

As described above, the semiconductor memory device of the present invention is compatible with a SRAM, and capable of a high-speed data transfer operation while maintaining data reliability, thereby being applicable to a compact apparatus requiring a large amount of memory.

While the invention has been described in detail, the foregoing description is in all aspects illustrative and not restrictive. It is understood that numerous other modifications and variations can be devised without departing from the scope of the invention.

What is claimed is:

1. A semiconductor memory device for performing a data rewrite, comprising:

a memory section including a memory element, the memory element having characteristics that a stored content is destroyed as a result of a read-out operation;

a timer control circuit for outputting a start signal, the timer control circuit being synchronous with the read-out operation, when either a first or a second signal takes an inactive state earlier than the other;

a timer circuit for outputting a timer signal for a predetermined period of time from when the start signal is outputted; and a memory section control circuit for activating the memory section during a time period from when the first signal takes an active state to when the timer signal stops being outputted, and performing a rewrite for the memory section while the timer signal is being outputted.

2. The semiconductor memory device according to claim 1, wherein the timer control circuit outputs the start signal even when a supplied power supply voltage detection signal indicates a reduction in a power supply voltage.

3. The semiconductor memory device according to claim 1, wherein the first signal is an external chip enable signal, and the second signal is an external write enable signal.

4. The semiconductor memory device according to claim 1, wherein the timer control circuit prevents an external signal from being inputted while the timer signal is being outputted.

5. The semiconductor memory device according to claim 1 further comprising:

an operation control circuit for receiving the second signal when the first signal takes an active state, and determining, in accordance with the received second signal, whether an operation to be performed is a data read-out or data write-in; and an access circuit for accessing to the memory section in accordance with the operation determined by the operation control circuit.

6. The semiconductor memory device according to claim [5] *1*, [wherein the] *further comprising:*

*an* access circuit [accesses] *for accessing*, after a predetermined period of time is elapsed from a transition of the first signal, to the memory section in accordance with either a transition of the second signal from the inactive state to the active state or a transition of the second signal from the active state to the inactive state.

7. The semiconductor memory device according to claim [6] *29*, wherein the first signal is [the] *an* external chip enable signal, and the second signal is [the] *an* external write enable signal.

8. The semiconductor memory device according to claim [6] *29*, wherein the first signal is [the] *an* external chip enable signal, and the second signal is an external output enable signal.

9. The semiconductor memory device according to claim 5, wherein, when the second signal performs a transition within a predetermined period of time from when the first signal takes the active state, an access to the memory section is controlled by a signal generated by an internal circuit.

10. The semiconductor memory device according to claim 5, wherein, when the second signal performs a transition after the predetermined period of time is elapsed from when the first signal takes the active state, the access to the memory section is controlled by an externally inputted signal.

11. The semiconductor memory device according to claim [6] *29*, wherein the memory section includes:

a sense amplifier for receiving data read out from the memory element; and a switch for disconnecting between the sense amplifier and the memory element, and the switch opens after the data read out from the memory element is received into the sense amplifier.

12. The semiconductor memory device according to claim 11, wherein the timer circuit outputs the timer signal after the switch opens.

13. The semiconductor memory device according to claim 1, wherein the memory element includes a ferroelectric cell.

14. The semiconductor memory device according to claim 1, wherein the memory element includes a dynamic cell.

15. A semiconductor memory device for performing a data rewrite, comprising:

a memory section including a memory element, the memory element having characteristics that a stored content is destroyed as a result of a read-out operation;

a timer control circuit for outputting a start signal, the timer control circuit being synchronous with the read-out operation, the timer control circuit outputting a start signal when, in a data read-out operation, a first signal takes an active state, or when, in a data write-in operation, either the first or a second signal takes an inactive state earlier than the other;

a timer circuit for outputting a timer signal for a predetermined period of time from when the start signal is outputted; and a memory section control circuit for activating the memory section during a time period from when the first signal takes the active state to when the timer signal stops being outputted, and performing a rewrite for the memory section while the timer signal is being outputted.

16. The semiconductor memory device according to claim 15, wherein the timer control circuit outputs the start signal even when a supplied power supply voltage detection signal indicates a reduction in a power supply voltage.

17. The semiconductor memory device according to claim 15, wherein the first signal is an external chip enable signal, and the second signal is an external write enable signal.

18. The semiconductor memory device according to claim 15, wherein the timer control circuit prevents an external signal from being inputted while the timer signal is being outputted.

19. The semiconductor memory device according to claim 15 further comprising:

an operation control circuit for receiving the second signal when the first signal takes the active state, and determining, in accordance with the received second signal, whether an operation to be performed is a data read-out or a data write-in; and an access circuit for accessing to the memory section in accordance with the operation determined by the operation control circuit.

20. The semiconductor memory device according to claim 19, wherein the access circuit accesses, after a predetermined period of time is elapsed from a transition of the first signal, to the memory section in accordance with either a transition of the second signal from the inactive state to the active state or a transition of the second signal from the active state to the inactive state.

21. The semiconductor memory device according to claim 20, wherein the first signal is [the] *an* external chip enable signal, and the second signal is [the] *an* external write enable signal.

22. The semiconductor memory device according to claim 20, wherein the first signal is [the] *an* external chip enable signal, and the second signal is an external output enable signal.

23. The semiconductor memory device according to claim 19, wherein, when the second signal performs a transition within a predetermined period of time from when the first signal takes the active state, an access to the memory section is controlled by a signal generated by an internal circuit.

24. The semiconductor memory device according to claim 19, wherein, when the second signal performs the transition after the predetermined period of time is elapsed from when the first signal takes the active state, the access to the memory section is controlled by an externally inputted signal.

25. The semiconductor memory device according to claim 20, wherein the memory section includes:

a sense amplifier for receiving data read out from the memory element; and a switch for disconnecting between the sense amplifier and the memory element, and the switch opens after the data read out from the memory element is received into the sense amplifier.

26. The semiconductor memory device according to claim 25, wherein the timer circuit outputs the timer signal after the switch opens.

27. The semiconductor memory device according to claim 15, wherein the memory element includes a ferroelectric cell.

28. The semiconductor memory device according to claim 15, wherein the memory element includes a dynamic cell.

*29. The semiconductor memory device according to claim 5, wherein the access circuit accesses, after a predetermined period of time is elapsed from a transition of the first signal, to the memory section in accordance with either a transition of the second signal from the inactive state to the active state or a transition of the second signal from the active state to the inactive state.*

*30. The semiconductor memory device according to claim 6, wherein the first signal is an external chip enable signal, and the second signal is an external write enable signal.*

*31. The semiconductor memory device according to claim 6, wherein the first signal is an external chip enable signal, and the second signal is an external output enable signal.*

*32. The semiconductor memory device according to claim 6, wherein the memory element includes a ferroelectric cell.*

* * * * *